US009450131B1

(12) United States Patent
Spence et al.

(10) Patent No.: US 9,450,131 B1
(45) Date of Patent: Sep. 20, 2016

(54) ROLLABLE AND ACCORDIAN FOLDABLE REFRACTIVE CONCENTRATOR SPACE SOLAR ARRAY PANEL

(71) Applicants: Brian R Spence, Solvang, CA (US); Stephen F White, Ventura, CA (US); Kevin Schmid, Santa Barbara, CA (US)

(72) Inventors: Brian R Spence, Solvang, CA (US); Stephen F White, Ventura, CA (US); Kevin Schmid, Santa Barbara, CA (US)

(73) Assignee: Deployable Space Systems, Inc., Santa Barbara, CA (US)

( * ) Notice: Subject to any disclaimer, the term of this patent is extended or adjusted under 35 U.S.C. 154(b) by 0 days.

(21) Appl. No.: 14/088,417

(22) Filed: Nov. 24, 2013

Related U.S. Application Data

(62) Division of application No. 13/410,278, filed on Mar. 1, 2012, now Pat. No. 8,636,253.

(51) Int. Cl.
*B64G 1/44* (2006.01)
*H01L 31/052* (2014.01)
*H01L 31/04* (2014.01)
*H02S 30/20* (2014.01)

(52) U.S. Cl.
CPC ......... *H01L 31/0524* (2013.01); *H01L 31/045* (2013.01); *H01L 31/0413* (2013.01)

(58) Field of Classification Search
CPC ........ B64G 1/443; B64G 1/222; B64G 1/44; H01L 31/0524; H01L 31/0413; H01L 31/045
USPC ........... 136/292, 246, 245; 244/172.9, 172.8, 244/172.7, 172.6, 159.5, 158.3; 135/124–131, 136–138
See application file for complete search history.

(56) References Cited

U.S. PATENT DOCUMENTS

| | | | | |
|---|---|---|---|---|
| 4,727,932 A * | 3/1988 | Mahefkey | ...................... | 165/41 |
| 4,815,736 A * | 3/1989 | Wright | ........................... | 473/421 |
| 5,344,497 A * | 9/1994 | Fraas et al. | ................... | 136/246 |
| 5,487,791 A * | 1/1996 | Everman et al. | ............. | 136/245 |
| 5,496,414 A * | 3/1996 | Harvey et al. | ................. | 136/245 |
| 5,505,789 A * | 4/1996 | Fraas et al. | ................... | 136/246 |
| 5,578,139 A * | 11/1996 | Jones et al. | .................... | 136/245 |
| 6,075,200 A * | 6/2000 | O'Neill | ........................... | 136/246 |
| 6,502,593 B1 * | 1/2003 | Stafford | ........................ | 135/115 |

* cited by examiner

*Primary Examiner* — Philip J Bonzell
*Assistant Examiner* — Michael Kreiner
(74) *Attorney, Agent, or Firm* — R. Scott Kimsey, Esq.; Klein DeNatale Goldner

(57) ABSTRACT

A rollable and accordion foldable refractive lens concentrator flexible solar array blanket structure assembly for a spacecraft/satellite application consisting of at least one or more rows of electrically interconnected solar cells and at least one or more rows of deployable elongated refractive lenses elevated and aligned from the top surface of the solar cells. The entire blanket assembly, inclusive of lenses and solar cell substrates, kinematically deploys by unrolling or unfolding the assembly for its stowed package configuration, and the final tensioning of the blanket assembly produces an aligned assembly where the solar cell substrate subassembly and the lens subassembly are coplanar. Deployment of the integrated blanket assembly (with refractive lenses) is directly coupled through the unrolling or the accordion unfolding deployment kinematics of the concentrator blanket assembly.

11 Claims, 17 Drawing Sheets

Outboard Tip Region

View with lenses

View without lenses

Mid-Span Region

View with lenses    View without lenses

Inboard Root Region

View with lenses    View without lenses

ROLLABLE AND ACCORDIAN FOLDABLE REFRACTIVE CONCENTRATOR SPACE SOLAR ARRAY PANEL

FIELD OF THE INVENTION

This invention relates to the field of solar arrays for space-based applications and, in particular, to Fresnel lens concentrator flexible-blanket solar arrays deployable from a spacecraft for photovoltaic energy conversion systems, whereas the solar arrays are stowable in a small volume for shipment and launch, and subsequently deployed for use in providing power to spacecraft during long missions in space.

BACKGROUND

A solar array or array, as defined herein, pertains to a structure that is attached to certain spacecraft vehicles or satellites, to provide power for spacecraft operations. The solar array is stowable into a small volume for shipment and launch, and is deployable when in space to expose a large surface area of photovoltaic (PV) solar cells to the sun, to collect solar radiation and convert it into the electrical power necessary to operate the spacecraft.

Power systems for space applications face numerous design constraints including criteria to minimize weight, minimize stowed volume, maximize beginning or life to end of life performance, and minimize cost. In certain prior art applications of solar arrays, the structure consists of flat rigid honeycomb panel substrates to which the solar cells are mounted that are configured for stowage by means such as hinges which will permit the panels to be folded against each other to minimize the dimensions of the array in the stowed configuration. The solar array typically comprises one or more solar panels electrically and mechanically attached to each other and to the spacecraft. Each solar panel in an array typically comprises numerous individual solar cells, which are usually laid out in rows and connected together electrically at their adjacent edges to form a two-dimensional array. The mechanical components and large stiff panels associated with rigid panel arrays involve added weight which is desirable to minimize. An example of such an array is shown in: Everman et al U.S. Pat. No. 5,487,791.

In order to allow for further reduction in the deployable solar arrays weight and stowed volume, the solar cells can be mounted to a light weight flexible substrate, or blanket instead of the large and heavy rigid honeycomb panels. Various flexible solar cell blanket substrates have been used, such as those fabricated from a fiberglass mesh or thin polymeric sheet upon which are bonded the numerous crystalline solar cells. Flexible photovoltaic (PV) blanket solar arrays are typically limited to crystalline solar cells packaged onto a long continuous roll or pleated and folded stack that is attached to and deployed by a separate deployment boom actuator, hub structure or other deployable structure requiring external motor power or material strain energy for deployment motive force.

The number of solar cells that must be employed on a solar array is a function of the anticipated spacecraft power demand and the efficiency of the cells. High-efficiency solar cells are typically employed to reduce the area of photovoltaics required by a specific spacecraft. This reduces panel (or flexible PV blanket) area and thus overall mass from the required supporting structure and minimizes the volume of the stowed power system. But such cell devices are extremely expensive, and in many cases cost impactive for certain applications. Solar cells are by far the most expensive component of a solar array. Because system cost and mass both increase directly with the number of solar cells employed, there is considerable economic incentive to reduce the quantity of solar cells that a spacecraft must carry on an array.

To reduce solar array cost and more mass efficiently shield the solar array from radiation exposure, reflective or refractive concentrator elements may be used to reduce the number of cells. Lightweight reflective surfaces have been used in various combinations with known rigid solar panels to produce power with fewer solar cells. Lightweight refractive optics develop by Fraas and O'Neill, U.S. Pat. No. 5,344,497 and U.S. Pat. No. 5,505,789, including using lenses such as point-focus or line-focus Fresnel optics to refract the solar illumination onto the cells, have also been used in various combinations with known rigid solar panels to produce power with fewer solar cells. By using relatively inexpensive Fresnel lens optics to collect the sunlight and to focus it onto much smaller solar cells, the cost and weight of the cells for an equivalently powered solar array are dramatically reduced. By using very high efficiency cells, the required array area is minimized, reducing overall system weight and launch volume.

Despite the many advantages of the Fresnel lens concentrating solar array previously invented by O'Neill and Fraas, this array still has shortcomings in need of improvement. Specifically, the Fresnel lens is presently made from a space-qualified, optically clear silicone rubber material (e.g., Dow Corning DC 93-500). In the late 1990's, NASA's New Millennium Deep Space 1 spacecraft implemented a line-focus Fresnel lens refractive concentrator rigid panel solar array. For this concentrator array, the 250-micron thick/thin rubber lens was laminated to a thin 80-microns thick ceria-doped glass superstrate to maintain the required arch shape of the lens assembly. The glass superstrate was required to provide structural strength and stiffness properties in the stowed and deployed configurations, but was not required for the optical functioning of the lens. Unfortunately, the implementation of the glass superstrate increases the weight, cost, launch volume, and fragility of the lens assembly. If the glass superstrate was not used for the Deep Space 1 concentrator solar array then the lens would not maintain its shape, even in the zero-gravity environment of space. The glass/silicone Fresnel lens used on Deep Space 1 also required a supporting structure to properly position the lens above the solar cells. This lens support structure added further weight, cost, and complexity to the solar power system. The glass/silicone Fresnel lens construction used on Deep Space 1 is also not flexible enough to be flattened for compact launch stowage, resulting in a higher than desired launch stowage volume. Finally, the glass/silicone Fresnel lens is affected by the difference in thermal expansion coefficients of the glass and silicone layers, causing either stresses or strains in the lens during temperature variations which occur when the satellite moves in and out of the Earth's shadow.

One means of addressing some of the problems associated with the glass superstrate in the presently used glass/silicone Fresnel lens is to make the polymer lens from a stronger, thicker material, obviating the structural need for the glass arch. Many stronger, thicker polymer lens materials that are different to DC-93500, such as Telfon and other flouropolymers, have been evaluated under NASA and DoD programs, but have had displayed limited survivability after exposure to the combined space environment. In U.S. Pat. No. 5,496,414, Harvey et al. describes one means of stowing and deploying such a monolithic polymer lens. In U.S. Pat.

No. 5,578,139, Jones et al. describes another means of stowing and deploying such a monolithic polymer lens. However, these prior art lenses must be thick enough and strong enough to be self supporting during ground testing, and therein lies yet another disadvantage. The lens thickness required to be self-supporting under one gravity acceleration ground testing is typically 250 microns or more for an 8 cm lens aperture width. Since the density of fluoro-polymers, and other possible alternative lens materials, is about double the density of the normal DC93-500 silicone rubber lens material, and the total lens thickness is about the same, the flouro-polymer lenses weigh about twice as much as the silicone lenses. Thus, even with the added weight of the glass arch superstrate, the Deep Space 1 glass/silicone lens construction is typically lighter than a potential monolithic fluoro-polymer lens. Most importantly and as previously stated, the monolithic fluoro-polymer lens material need for the Harvey and Jones design embodiments does not have the proven successful space flight history and heritage of the silicone lens material.

U.S. Pat. No. 6,075,200, O'Neill, describes a single monolithic DC93-500 silicone material Fresnel lens that is stretched and strained to provide strength and stiffness in the deployed configuration. The O'Neill invention uses one-dimensional lengthwise tension to support the thin lens material in the space environment and produce a precise lens optical shape while retaining lightweight and the use of space proven DC93500 lens materials. This tensioning approach enables the lens to maintain an ideal, arched, curvilinear shape, with absolutely no aperture blockage over the full stretched length of the lens. The O'Neill invention employs an arched shaped structure and spring powered hinge mechanisms at each end of each relatively short lens segment. Each lens segment, with integral arch structures and spring hinge mechanism at each lens end allows the lens to be folded flat against the photovoltaic receiver/waste heat radiator assembly, for minimal launch volume. Once on orbit in space, the spring powered mechanisms on each lens arch structure on each end of each lens segment deploy and pop-up into place, thereby lightly tensioning the lens in one direction. By maintaining a small lengthwise stretching force on the lens, either with springs or flexible structure, small differential thermal expansion and contraction of the lens relative to the solar cell receiver/radiator structure is accommodated. A major drawback of the O'Neill embodiment of U.S. Pat. No. 6,075,200 is that its only particularly suited for integration of strength lens segment assemblies onto conventional rigid honeycomb panels. The tensioning loads of the lens results in a compressive load onto the base solar cell receiver/radiator structure, whereby a more rigid and heavier receiver/radiator structure of honeycomb construction is required. The requirement for a more rigid and heavier, or honeycomb, structure prohibits the ability to accordion fold or roll the entire solar array panel assembly and create an extremely compact stowage volume, a feature particularly desired by the end-user. Additionally, the O'Neill embodiment requires a number of parts and complex mechanization to achieve stowage and deployed states which further increase mass and cost. Finally, the O'Neill embodiment involves bi-direction folding of discrete lens elements and arches towards each other. Bi-directional folding does not lend itself towards rolled stowed packaging architectures and does not produce as compact of stowed package. The proposed embodiment contained herein involves unidirectional folding/collapsing of the lens segments and supporting arches which lends itself to both compact rolled and accordion folded flat-pack stowage architectures, and overall produces a more compact stowage.

The O'Neill U.S. Pat. No. 6,075,200 fails to adequately address another critical problem with stretched lens concentrator embodiment, which being the differential thermal expansion between the lens material and the support structure, especially in the direction of greatest linear dimension. In the earth orbital space environment extreme variations in temperature are realized as the deployed solar array enters and leaves the shadow of the earth. In the earth's shadow temperatures as low as −180 degrees Celsius are endured, while out of the earth's shadow and exposed directly to the solar illumination temperatures as high as 110 degrees Celsius are endured. In earth orbital space applications the optics need to operate reliably and maintain positional accuracy while out of the earth's shadow and exposed directly to the solar illumination. Operating temperatures beyond earth orbital applications, and near the solar system outer planets (at Jupiter or Saturn at distances of 5 to 7 astronomical units, respectively), can be as low as −180 degrees Celsius while exposed directly to the solar illumination. For these outer planets missions it is imperative the refractive lens concentrator optics have the ability to accommodate broad temperature extremes while maintaining precise positional alignment of the optics and with negligible distortion. The presently used silicone lens material expands and contracts at an enormous rate with temperature (more than 300 parts per million per degree Centigrade) with respect to its supporting structure and tensioning system. An unrestrained 30 cm (1 foot) long lens will expand and contract more than 2 cm (8%) in length during an outer planets mission temperature excursion from −180 to 110 degrees Celsius. In contrast, a typical graphite/epoxy space structure will expand and contract several hundred times more slowly with temperature than the lens material. The differential thermal expansion problem is somewhat addressed in the O'Neill embodiment, but only for earth orbital applications were very small temperature extremes are realized. However, the differential thermal expansion problem is significant for an outer planets mission where very large operating temperature extremes are apparent, and as such must be addressed for an acceptable stretched lens space solar concentrator, but the prior art does not teach a solution to this problem.

Accordingly, several objects and advantages of the proposed embodiment are to provide improved refractive lens concentrator solar arrays for space power applications, said improved solar array concentrators providing lower mass, more compact stowage volume for launch, lower cost, more reliable deployment on orbit, flexible stowage packaging of either compact rolled or accordion folded compactly stowed architectures, and sustainable and reliable operation under very broad temperature exposure.

SUMMARY

A rollable and accordion foldable refractive lens concentrator flexible solar array blanket structure assembly for spacecraft/satellite applications is disclosed. The proposed embodiment is a foldable, and rollable concentrator flexible blanket panel assembly that consists of at least one or more rows of electrically interconnected solar cells and at least one or more rows of deployable elongated refractive lenses elevated and aligned from the top surface of the solar cells.

The proposed concentrator space solar array panel assembly is specifically designed for flexible blankets architectures. The technology embodiment accommodates standard state-of-the-art multi-junction crystalline space solar cell technologies and advanced next-generation ultra-high efficiency photovoltaics, and significantly reduces the cost and mass of flexible blanket space solar arrays. The proposed technology dramatically reduces solar array costs by replacing a significant portion of the very expensive solar cells with a simple and space-proven refractive concentrating lens element, and dramatically reduces stowed volume by allowing for a compact rolled or accordion folded flat package stowed configuration.

In the deployed configuration the refractive lenses and the solar cell rows are precisely positioned in-line with each other and at the optimum focal height such that the lens focuses sunlight onto the solar cells. The solar cells are mounted onto a radiating substrate whose backside heat-rejecting area is nearly equal to or greater than the total solar illumination collection area from the lenses. The refractive lenses are either a convex arched shaped, or flat shaped, when viewing from the incident illumination side, and nominally produce an 8× concentration to focus sunlight onto very small area solar cells.

The refractive lenses are composed of either a continuous length lens or multiple lens segments that are butted/adjoined to adjacent lens segments, respectively. The refractive Fresnel lenses are manufacture from molded silicone DC93500 elastomeric materials and employ protection frontside coatings to promote compatibility and survivability within space environment. In the deployed configuration the refractive lens is mounted so that the lens is elevated to the optimum focal height and positioned precisely in-line from its complimentary row of solar cells, and refracts/focuses incident radiation onto the respective row of solar cells when the lens is in a deployed position. The one or more refractive lens rows are mounted to the radiating substrate through unidirectional flexible hinging couplings that allow the entire lens elements to be flattened and then rolled for stowage to produce a compact cylindrical stowed package, or accordion folded for stowage to produce a compact flat stowed package. The entire blanket assembly, inclusive of lenses and solar cell substrates, kinematically deploys by unrolling or unfolding the assembly for its stowed package configuration, and the final tensioning of the blanket assembly produces an aligned assembly where the solar cell substrate subassembly and the lens subassembly are coplanar. Deployment of the integrated blanket assembly (with refractive lenses) is directly coupled through the unrolling or the accordion unfolding deployment kinematics of the concentrator blanket assembly. The deployed state and aligned shape of the concentrator blanket assembly is maintained though minor blanket preload/tensioning.

The entire concentrator blanket assembly is constructed of multiple common lens and solar cell receiver/substrate modules that can be mechanically and electrical rapidly assembled/disassembled to create any desired blanket length/width mosaic. The modules are purposely identical in construction to maximize modularity so they can be mass-produced in quantity to significantly reduce cost. For blanket stowed packaging and solar cell protection from the launch environment discrete small-area heritage open-cell polyimide foam elements are integrated to the blanket back side. The foam elements control spacing of the blanket wraps in the rolled stowed configuration, provides damping from vibration to protect the delicate solar cells from the launch environment in the rolled or accordion-folded stowed configurations, and prevent inter-layer snagging or blocking of adjacent blanket wraps or folds in the stowed configuration.

For multi astronomical unit distance missions to the inner and outer solar system, where the solar array is exposed to very broad temperature ranges, a series of spring elements coupled to the lens elements that have sufficient stroke to maintain proper lens tension over the entire expected range of structural and thermal environments can be implemented. The additional spring system allows the lens to adjust its overall length while the system maintains the proper load required on the lens to produce the required strain. The spring system can be segregated into discrete lens tensioning segments or a single large displacement tensioning system implemented into the solar array blanket assembly and coupled with the deployable structure. Both options offer a lens deployment system that allows the lens to stow flat against the blanket for launch while deploying the lens to the proper position and applying a proper lens load throughout any possible and expected thermal environment.

The entire concentrator blanket assembly is adaptable to typical flexible blanket solar array deployable structural platforms, particular flexible blanket solar array technologies that utilize solar array blanket assemblies that can be either compact rolled or accordion folded as a flat package for stowage. The proposed embodiment has tremendous stowage packaging versatility of either compact rolled or accordion folded compactly stowed architectures, and sustainable and reliable operation under very broad temperature exposure. The required smaller solar cell size, which is approximately ~85% smaller than cells used on classical non-concentrated planar arrays for operation at an 8× concentration ratio, allows for far less solar cell area, mass, and cost per kW, and provides a more cost-effective implementation of high efficiency devices, particularly for emerging and very expensive ultra advanced photovoltaic devices. Fewer solar cells required translates into enormous solar array system benefits to the end-user in terms of dramatically reduced cost, significantly lower mass, and the ability to completely-insulate and super-radiation-shield the solar cells without experiencing a significant mass penalty. These inherent features enable low cost, and high radiation and/or high voltage missions for the end-user. The proposed technology embodiment's unique, lightweight, and efficient design leads to outstanding performance metrics in areal power density ($W/m^2$), stowed power density ($kW/m^3$), specific power (W/kg) and overall cost-effectiveness. The design embodiment's intrinsic characteristics also protect against electrical discharge, micrometeoroid impacts, and radiation degradation. The technology can also provide arc-free high voltage operation because the solar cell strings/circuits are significantly separated from one another, and can be more easily fully encapsulated from the LEO plasma or GEO charging environments.

The invention can be summarized as a deployable solar array panel comprising a rollable, flexible structure that forms a cylindrical package for stowage and a longitudinal, substantially rectangular planar structure upon deployment. The cylindrical package is configured to store elastic energy such that, upon unrolling deployment, the release of the elastic energy positions the solar array panel into a taunt, aligned, and fully functional deployed configuration. The deployable solar array panel may further comprise a top surface, a bottom surface opposite the top surface, two ends, and two open sides. The first end of the two ends comprises a tip end. The second end of the two ends comprises a root end opposite the tip end. The bottom surface is connected to both the root and the tip. The top and the bottom surfaces are mutually connected by an elastic structural system. The elastic structural system provides structural alignment and support of the solar array panel in the deployed configuration. The deployable solar array panel may further comprise a solar blanket assembly. The solar blanket assembly defines the bottom surface of the solar array panel. The solar blanket assembly is comprised of a flexible substrate supporting an array of solar cells. A refractive lens assembly defines the top surface of the solar array panel. The refractive lens assembly comprises a set of flexible lenses supported by two or more supportive frames. The refractive lens assembly is spatially offset from the solar blanket assembly by the elastic structural system such that optimal concentration of solar radiation upon the array of solar cells is achieved. The elastic structural system of the deployable solar array panel may be rigidly attached to the solar blanket assembly. The elastic structural system is rigidly congruent with at least one of the supportive frames of the refractive lens assembly to create a lens assembly support system. The deployable solar array panel may further comprise an inline cabling system. The inline cabling system attaches to one supportive frame of the lens assembly support system at the tip end and another supportive frame of the lens assembly support system at the root end, thereby providing inline tension to the refractive lens assembly. The inline cabling system may be a continuous inline cabling system. The continuous inline cabling system spans the solar array panel, aligning and supporting each of the supportive frames. At least one of the supportive frames may be a sliding frame, free to slide along the continuous inline cable. It is attached to one of the two ends by a low tension cable, thereby providing inline tension while allowing for thermal expansion and contraction of the refractive lens assembly. The elastic structural system of the deployable solar array panel may comprise two or more rows of elastic structural elements. Each row is congruent with one of the supportive frames of the refractive lens assembly. Each row is connected to the succeeding row by compression rods. The compression rods maintain spacing between the rows while providing structural support for the refractive lens assembly. One of the supportive frames of the deployable solar array panel may be a sliding frame, free to slide along the compression rods. The sliding frame is attached to one row of the elastic structural elements by a low tension cable or spring, thereby providing inline tension while allowing for thermal expansion and contraction of the refractive lens assembly.

An alternate embodiment of the deployable solar array panel comprises an accordion folded structure that forms a compact package for stowage and a longitudinal, substantially rectangular planar structure upon deployment. This embodiment of the solar array panel comprises a top surface, a bottom surface opposite the top surface, two ends, and two open sides. The first end of the two ends comprises a tip end. The second end of the two ends comprises a root end opposite the tip end, A segmented solar blanket assembly defines the bottom surface of the solar array panel. The segmented solar blanket assembly is comprised of a segmented substrate supporting an array of solar cells wherein each segment of the segmented substrate is allowed to hinge at its ends. The segmented substrate is interspersed with interfacing components connecting to each segment of the segmented substrate. A segmented refractive lens assembly defines the top surface of the solar array panel. The refractive lens assembly comprises a set of flexible lenses supported by two or more supportive frames. The supportive frames of the refractive lens assembly are aligned with the interfacing components of the segmented solar blanket. The refractive lens assembly is spatially offset from the segmented solar blanket assembly such that optimal concentration of solar radiation upon the array of solar cells is achieved. This embodiment may further comprise an inline cabling system. The inline cabling system spans the longitudinal length of the segmented solar blanket, aligning and supporting each of the arched frames. The interfacing components comprise a set of positioning columns and arched frames forming a fixed connection between the segmented solar blanket and the segmented refractive lens assembly at the root end and the tip end. The interfacing components may further comprise a set of positioning columns and arched frames connected to the inline cabling system and forming a pivoting connection between the segmented solar blanket and the segmented refractive lens assembly at the interfaces between each segment. At least one of the supportive frames may be a sliding frame, free to slide along the inline cable. The sliding frame is attached to the fixed connection by a low tension cable, thereby providing inline tension while allowing for thermal expansion and contraction of refractive lens assembly. The interfacing components may comprise two or more rows of elastic structural elements connecting to each component of the segmented solar blanket. Each row may be congruent with one of the supportive frames of the refractive lens assembly. Each row is connected to the succeeding row by compression rods. The compression rods maintain spacing between the rows while providing structural support for the refractive lens assembly. One of the supportive frames may be a sliding frame, free to slide along the compression rods. The sliding frame is attached to one row of the elastic structural elements by a low tension cable or spring, thereby providing inline tension while allowing for thermal expansion and contraction of the-refractive lens assembly.

DETAILED DESCRIPTION OF THE
PREFERRED EMBODIMENTS

Glossary of Terms

Solar Array—A structural and electrical system which is stowable in a small volume for shipment and launch, and that is deployable when in space to expose a large surface area of photovoltaic devices (solar cells) to the sun, and that is mechanically and electrically attached to a spacecraft vehicle to provide power for spacecraft operations Flexible solar array—a solar array as described above that includes a rollable or accordion foldable thin flexible blanket or substrate to which the photovoltaic devices (solar cells) and reflective concentrators are mounted.

Flexible photovoltaic (PV) blanket—A thin flexible substrate that has mounted to it an array of photovoltaic solar cells (and refractive concentrators) and associated wiring that can be folded into a small and compact package for stowage; and is attached to the deployable solar array structure for unfurling during deployment into a flat, aligned, and tensioned configuration when fully deployed.

Deployable solar array structure—the structural components of a solar array that are attached to the flexible PV blanket ends and provide the motive force for blanket unfolding or unfolding deployment and deployed tensioning, and provides the primary deployed structural strength and stiffness characteristics of the solar array.

Solar cell rows—numerous individual solar cells (the number of solar cells that must be employed is a function of the anticipated spacecraft power demand and the efficiency of the cells), which are laid out in linear rows onto the flexible photovoltaic blanket and connected together electrically at their adjacent edges.

Refractive Fresnel Lens, Lens Assembly and Lens Rows—A thin lightweight rollable or accordion foldable linear element, flat or arched shaped, and constructed of flexible DC93500 silicone elastomeric material with protective frontside coatings, mounted directly above the solar cell row and accurately positioned so that it captures incident solar radiation (light) and refracts it onto the solar cell row directly below to increase illumination onto the cells.

Concentrator—refractive lens photovoltaic panel assembly that is shaped-positioned so as to multiply the intensity through refraction of the nominal incident solar radiation onto the solar cells.

Radiator substrate and solar cell receiver—the backside planar substrate upon which the solar cell rows and lens arch structures are mounted that provides a thin, flat surface area that is thermally conductive and has sufficient area to reject waste heat from the solar cells via radiation to space from the side opposite the illuminated solar cell/refractive lens side.

Continuous radiator substrate—radiator substrate comprised of a continuous thin sheet construction with integrated hinge line regions that are aligned with the accordion foldable regions of the blanket assembly; and comprises the flexible structural back plane forming part of the deployable solar array structure's flexible PV blanket.

Modular/discrete radiator substrate—radiator substrate assembly comprised of individual discrete planar radiator substrates attached to the hinged back plane to form a larger flexible blanket assembly and facilitate accordion folding.

Back plane—The structural portion of the flexible photovoltaic blanket attached to the deployable solar array structure and tensioned when deployed; it can be either comprised of the continuous radiator substrate or continuous foldable longitudinal strips or continuous open weave mesh, cloth or polymer membrane material.

Hinge line—a location on the lens, radiator substrate or backplane that allows folding articulation to allow the flexible PV blanket/concentrator assembly to stow/package and deploy in an accordion fan-fold manner.

In-line cabling system—high tension chords—Directional chords coincident with the lens assembly. Responsible for providing the final deployed position and alignment of the lens with respect to the solar cell substrate for certain embodiments.

Elastic structural support system, arch structures—The structural support system for the lens assembly that is collapsible for stowage and elastically deployable into its final position.

Supportive frame, lens support frame, arch frame, sliding frame—A flat or arch feature onto which the lens interfaces that provides support and alignment for the lens in the deployed position.

Lens assembly support system—The combined components of the elastic structural support and supportive frame.

Compression rod—An integral structural compression member that reacts the lens tension loads allowing for negligible resultant loads onto the solar cell substrate.

DESCRIPTION OF ITEMS IN THE FIGURES

Figure 1:
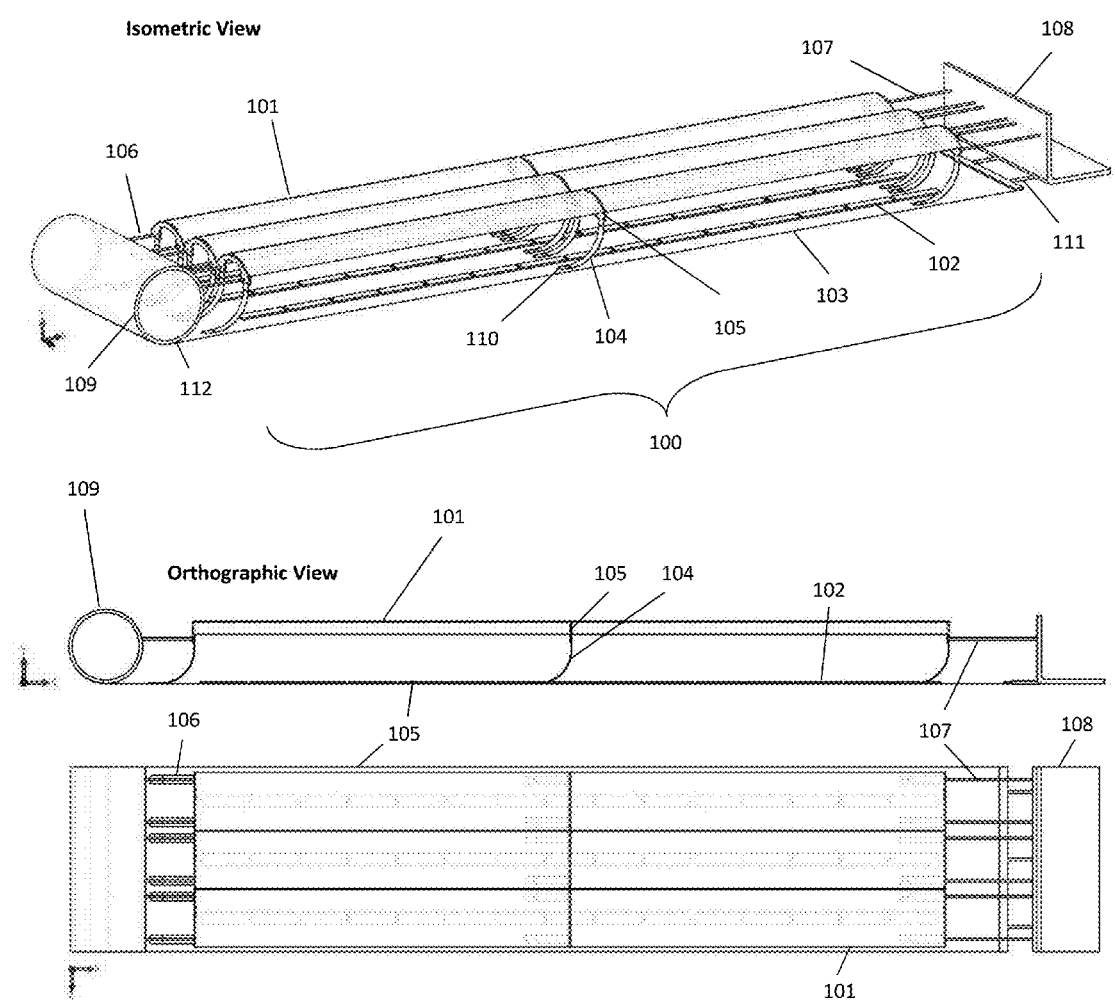
FIG. 1—Depicts relative components in isometric and orthographic views for the refractive concentrator space solar array panel assembly for a compact rolled stowage packaging architecture.

100—Rollable and/or accordion foldable refractive concentrator blanket assembly, inclusive but not limited to; Lenses (101), solar cell receivers (102), solar cell substrate/radiator (103), rollable and foldable lens support structures (104 and 105), inboard and outboard lens tension chords (106 and 107), inboard and outboard solar cell substrate to deployment structure interface attachments (111 and 112), inboard and outboard deployment structure elements (108 and 109), and electrical harness for the transfer of power and telemetry signals.

101—Linear refractive Fresnel lens element shown in arched shape configuration. Lens can also be flat shaped and integrates in the same manner as shown.

102—Solar cell rows, solar cell receivers, interconnected electrically and laid down onto the radiator substrate backplane (103).

103—Solar cell substrate, radiator, radiator backplane. Provide the planar surface onto which the solar cell rows (102) and lens support structures (104) are mounted, and provides the planar surface for radiative heat rejection.

104—Curved lenticular structural spring lens support elements. Provides lens support and coupling to the solar cell substrate (103) and precise vertical positioning and lateral alignment of the lens elements to the solar cell rows. The curved lenticular structural spring lens support elements (104) can also incorporate integrated arch element features (105) within a single unified structure.

105—Arch elements, lens support frames. Arch elements can be integral with the curve lenticular structural elements (104) or not integral. Arch elements can be replaced with linear flat elements when a flat Fresnel lens is implemented.

106—Outboard tip tension chords. Provides the geometric couple of the lens assemblies to the deployable structure at the outboard tip portion of the solar array

107—Inboard root tension chords. Provides the geometric couple of the lens assemblies to the deployable structure at the inboard root portion of the solar array.

108—Inboard deployable root structure. The inboard structure of the deployable structural system onto which the entire concentrator blanket assembly is coupled onto, inclusive of the lens assemblies and radiator substrate assemblies.

109—Outboard deployable mandrel structure. The outboard tip structure of the deployable structural system onto which the entire concentrator blanket assembly is coupled onto, inclusive of the lens assemblies and radiator substrate assemblies, and which the entire concentrator blanket assembly is rolled upon for stowage to obtain a compact rolled stowed package.

110—Attachment of curved lenticular spring elements (104) onto the solar cell substrate/radiator (103). The attachment can be made via mechanical or adhesively bonded means

111—Inboard solar cell substrate/radiator to deployment structure interface attachment. Coupled attachment locations for the inboard portion of the solar cell substrate/radiator (103) onto the inboard root deployment structure element (108).

112—Outboard solar cell substrate/radiator to deployment structure interface attachment. Coupled attachment locations for the outboard portion of the solar cell substrate/radiator (103) onto the outboard tip deployment structure element (109).

200—Rollable and/or accordion foldable refractive concentrator blanket assembly for multi-astronomical unit distance applications and reliable operation within broad temperature extremes, inclusive but not limited to; Lenses (101), solar cell receivers (102), solar cell substrate/radiator (103), rollable and foldable lens support structures (104 and 105), sliding arches (202), longitudinal high tension chords (201), low tension chords (203), center lifting arches (205), light spring tension system (204) inboard and outboard solar cell substrate to deployment structure interface attachments (111 and 112), inboard and outboard deployment structure elements (108 and 109), and electrical harness for the transfer of power and telemetry signals.

201—Longitudinal high tension chords, in-line cabling system. High tension chords span the tip and root of the deployable structure and provide final deployment positioning and lens tensioning with respect to the deployable structure and solar cell substrate/radiator assembly (102).

202—Sliding arch, sliding support frame. Sliding arches structures attach to non-fixed end of the lens, and periodically along the midspan of the lens, and designed to ride and slide upon the longitudinal high tension chords (201).

203—Low tension chords. A series of low tension lens chords (203) are attached to the last sliding arch of a lens assembly. The low tension chords are (203) attached to the inboard root structure (108) thru a light tension spring system (204).

204—Light tension spring system. Light spring tension system provides broad stroke to maintain proper lens tensioning during operation under broad temperature ranges expected during multi astronomical distance space missions.

205—Center lifting arches, center structural support. The center lifting arches are lenticular spring elements without a full arch, and interface with the longitudinal high tension chords (201) to ensure proper lens deployed positioning during the deployment of the blanket assembly.

300—Accordion foldable refractive concentrator blanket assembly, inclusive but not limited to; Lenses (101), solar cell receivers (102), solar cell substrate/radiator (103), tip platen (301), base platen (302), tip side arch structures (303), base side arch structures (305), diagonal member (304), longitudinal high tension chords (201), column arch structures (306), half arches (307), inboard and outboard solar cell substrate to deployment structure interface attachments (111 and 112), inboard and outboard deployment structure elements (108 and 109), and electrical harness for the transfer of power and telemetry signals.

301—Tip platen. Stiff tip and base platens (301 and 302) at each end of the blanket assembly (300) provide stiffness, strength, and captivity of the blanket assembly (300) for survivability within a launch vibration environment.

302—Base platen. Stiff tip and base platens (301 and 302) at each end of the blanket assembly (300) provide stiffness, strength, and captivity of the blanket assembly (300) for survivability within a launch vibration environment.

303—Tip side arch structures, tip support structures. Tip side arch structures (303) attached to lens rows (101) are anchored to align at 90 degrees to the tip platen (301) in the deployed configuration through discrete length diagonal members (304).

304—Diagonal members. Attached to side arch structures to anchor and align the arch structures at 90 degrees with respect to the platens (301 and 302).

305—Base side arch structures, base support structures. Base side arch structures (305) attached to the opposite end of the lens row (101) are anchored to align at 90 degrees to the base platen in the deployed configuration through discrete length diagonal members (304).

306—Column structures. Column arch structures (306) located periodically throughout the blanket midspan, and coinciding periodically with a blanket fold-hinge location and attaching to the blanket fold-hinge location, periodically support the high tension chords (201) to provide proper positioning, location, support of the lens assemblies (101).

307—Half arches, lens support arch. Half arches (307) periodically attached along the length of each lens row are also attached to the tensioned chords (201) at their base and maintain precise lens location and shape over the lens rows.

400—Accordion foldable refractive concentrator blanket assembly for operation in multi astronomical unit distances and in broad temperature extreme environment, inclusive but not limited to; Lenses (101), solar cell receivers (102), solar cell substrate/radiator (103), tip platen (301), base platen (302), tip side arch structures (303), base side arch structures (305), diagonal member (304), longitudinal high tension chords (201), column arch structures (306), half arches (307), inboard and outboard solar cell substrate to deployment structure interface attachments (111 and 112), sliding arches (202), light tension chords (203), light spring system (204), inboard and outboard deployment structure elements (108 and 109), and electrical harness for the transfer of power and telemetry signals.

500—Rollable or accordion foldable refractive concentrator space solar array panel assembly (500) that can orientate the lens assemblies both laterally or longitudinally along the deployment axis, and is operable in multi astronomical unit distances and in broad temperature extreme environments. The embodiment is similar to the design shown in FIG. 1, with the exception that sliding arches (202), light spring elements (204), and compression rods (501) are integrated and are in-line with the lens rows to maintain proper lens tension during operation at broad temperature extremes without the need to terminate the tip or base portions of the lens rows to either the inboard or outboard deployment structures.

501—Compression rods. The compression rods (501) independently react the tension loads within the lens assemblies (101) applied by the light spring elements (204) which produces a negligible resultant load in the solar cell substrate/radiator assembly (103). This self support feature and independent load reaction that the compression rods provide allows for the placement of the lens rows and solar cell rows either longitudinally or laterally with respect to the deployment axis.

DESCRIPTION

Figure 2:
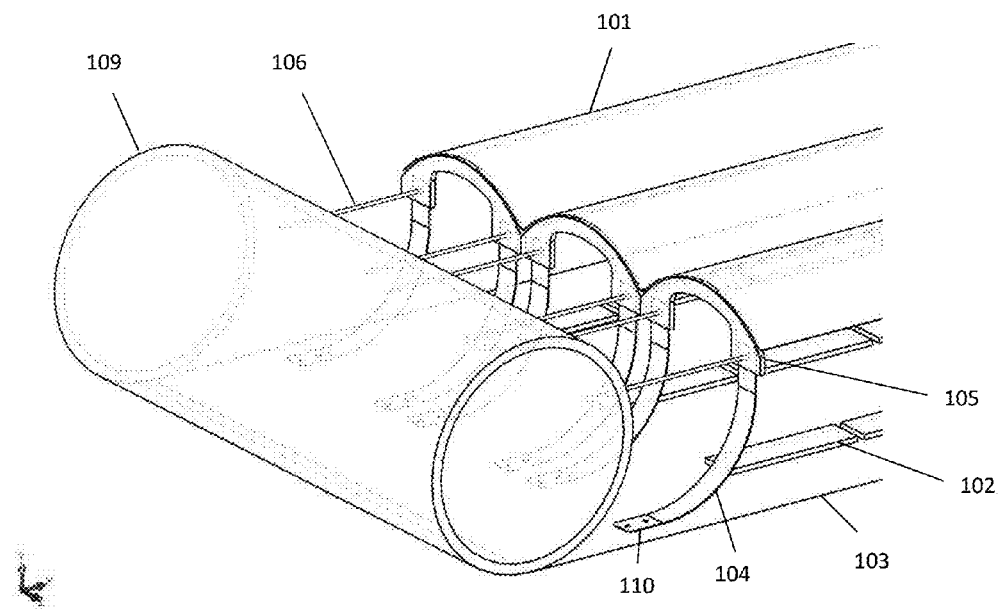
FIG. 2—Depicts a close up from FIG. 1 of the outboard solar array portion of the mandrel deployable structure (109), associated tip tension chords (106), curved lenticular spring elements (104), lenses (101), and the solar cell substrate (103).
Figure 3:
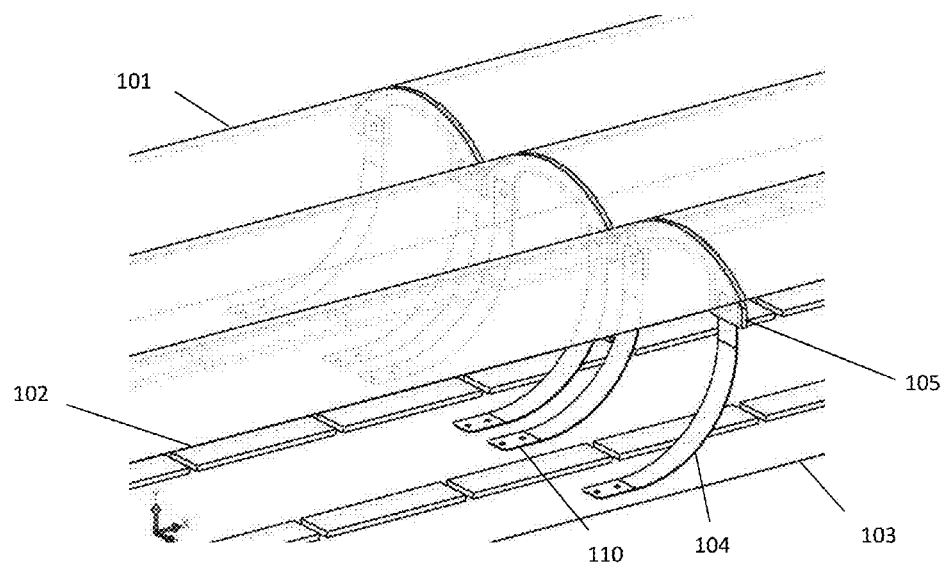
FIG. 3—Depicts a close up from FIG. 1 of the center portion of the blanket assembly showing the deployed arch structures (104) that lift and position the lenses into the correct focal height and lateral location.
Figure 4:
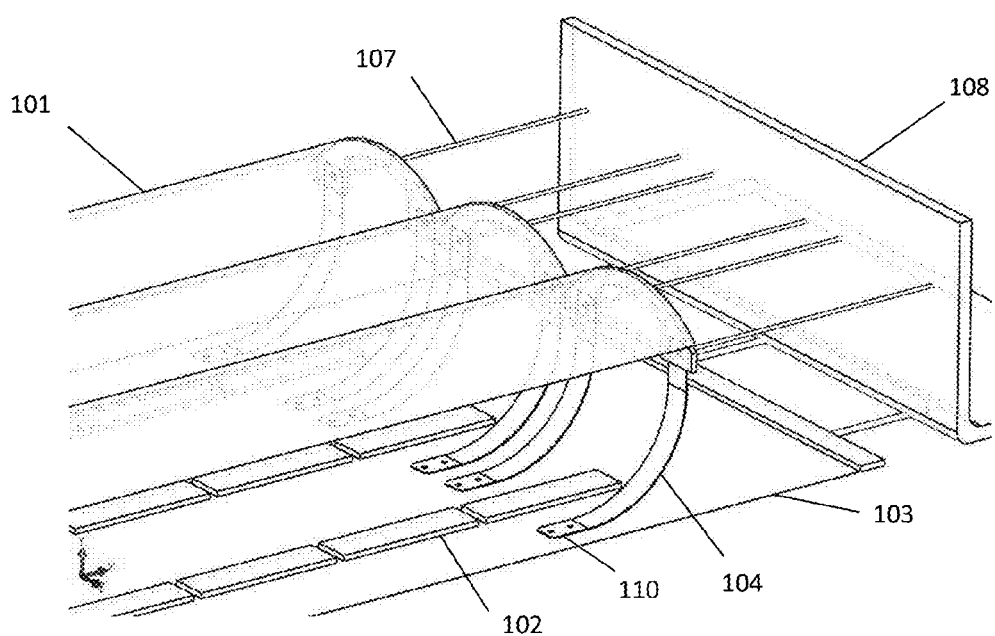
FIG. 4—Depicts a close up from FIG. 1 of the inboard solar array portion of the inboard root deployable structure (108), associated root tension chords (107), curved lenticular spring elements (104), lenses (101), and the solar cell substrate (103).
Figure 5:
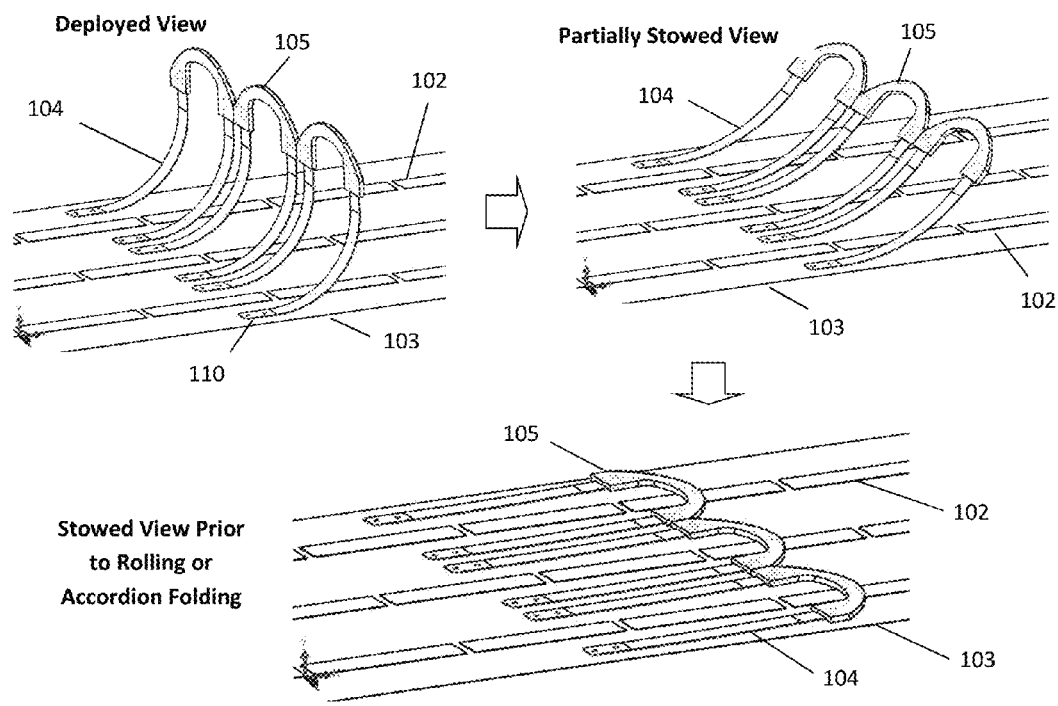
FIG. 5—Depicts a close up from FIG. 1 and without the lenses (101) of the center portion of the blanket assembly and a sequence of images showing the sequential stowage sequence of the arch structures (104 and 105) onto the solar cell substrate/radiator (102) prior to the concentrator blanket assembly being rolled to a compact cylindrical package or accordion folded to a flat stowed package.
Figure 6:
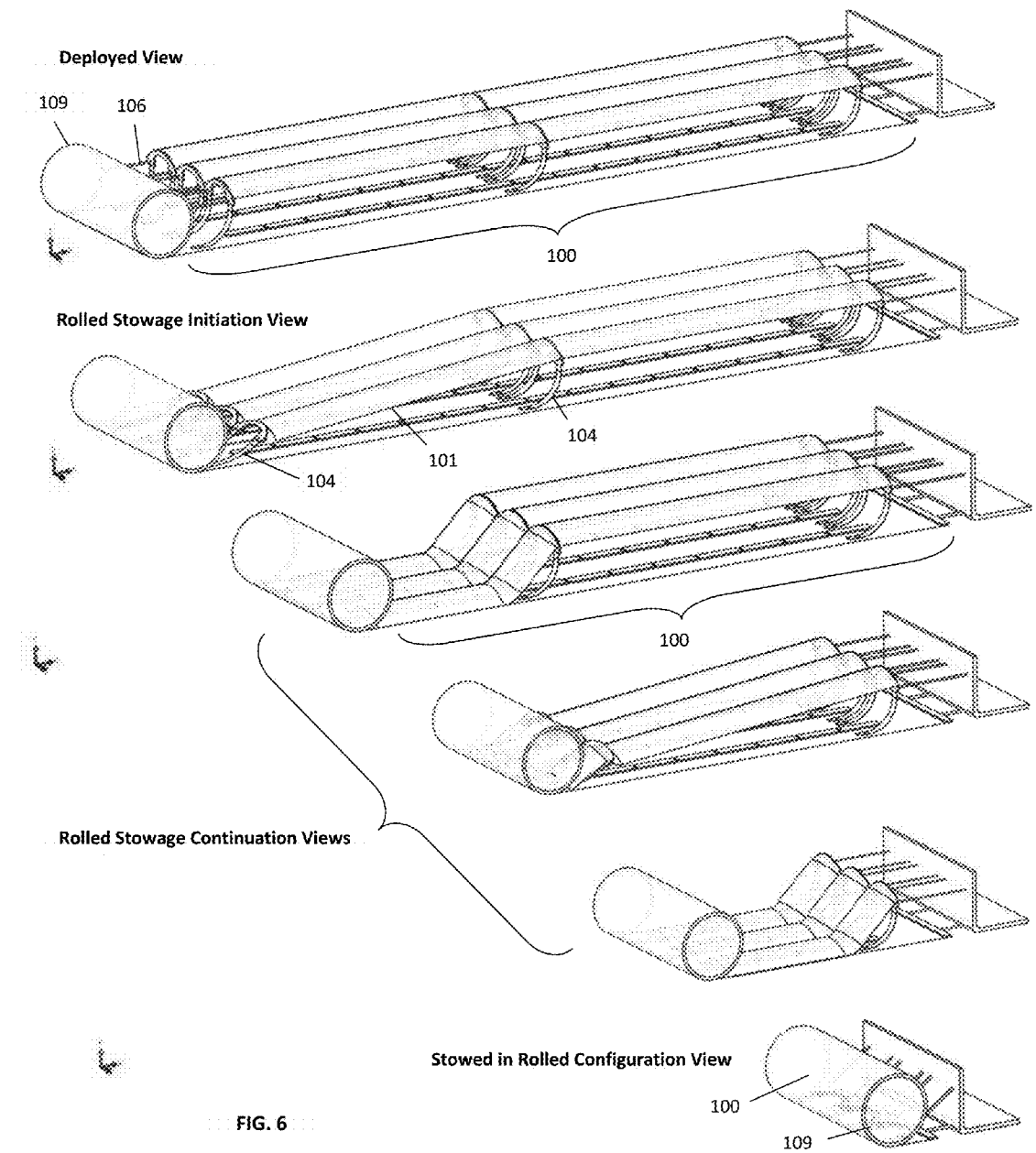
FIG. 6—Sequence of images depicting the entire rolled stowage sequence of the concentrator blanket assembly (100)

FIG. 1 depicts relative components in isometric and orthographic views of the preferred embodiment for the refractive concentrator space solar array panel assembly for a compact rolled stowage packaging architecture. Lenticular spring elements (104) provide both deployment lifting force and structure for lenses (101). When stowed the spring/arch structures (104 and 105) lie almost flat against the solar cell substrate/radiator assembly (103) and allow the lenses (101) to fall flat to blanket plane. The flattened planar assembly can then be rolled onto a mandrel type structure (109) for stowage into a compact rolled cylindrical volume. Tension chords near the tip and root deployable structure (106 and 107) provide final deployment positioning and lens tensioning with respect to the deployable structure and solar cell substrate/radiator assembly. The tip and root tension chords (106 and 07) are in the lens assembly plane so the blanket assembly deformation is minimized/eliminated. FIG. 2 depicts a close up from FIG. 1 of the outboard solar array portion of the mandrel deployable structure (109), associated tip tension chords (106), curved lenticular spring elements (104), lenses (101), and the solar cell substrate (103). As the mandrel structure (109) is rolled for stowage; the tension chords (106) become slack, the lenses (101) become slack, and the mandrel rolls up onto the curved lenticular spring elements (104) which forces the lenses (101) in contact with the solar cell substrate (103) and in the same plane to enable rolled stowage. FIG. 3 depicts a close up from FIG. 1 of the center portion of the blanket assembly showing the deployed arch structures (104) that lift and position the lenses into the correct focal height and lateral location. Each lens row (101) is in even and consistent lateral and longitudinal tension within the assembly. The feature shown in FIG. 3 can be periodically replicated along the length of the entire solar array with as many center lifters as required to ensure precise location and alignment of the lenses (101). FIG. 4 depicts a close up from FIG. 1 of the inboard solar array portion of the inboard root deployable structure (108), associated root tension chords (107), curved lenticular spring elements (104), lenses (101), and the solar cell substrate (103). FIG. 5 depicts a close up from FIG. 1 and without lenses (101) of the center portion of the blanket assembly and a sequence of images showing the sequential stowage sequence of the arch structures (104 and 105) onto the solar cell substrate/radiator (102) prior to the entire concentrator blanket assembly being rolled to a compact cylindrical package or accordion folded to a flat stowed package. The lenses (101) have been removed from FIG. 5 to provide better clarity of the stowage/flattening of the arch structures (104 and 105). FIG. 6 depicts a sequence of images showing the rolled stowage sequence of the concentrator blanket assembly (100)

Figure 7:
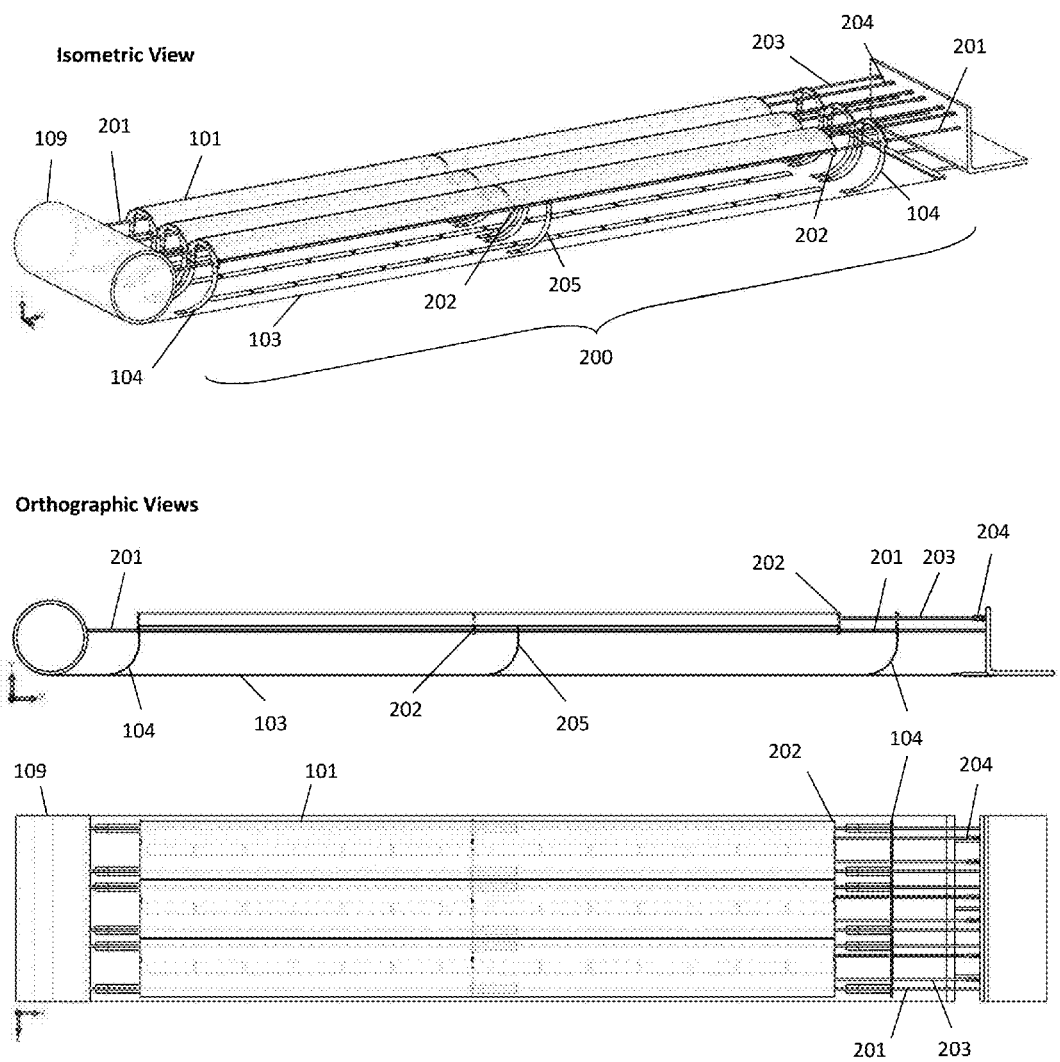
FIG. 7—Depicts relative components in isometric and orthographic views for the refractive concentrator space solar array panel assembly for a compact rolled stowage packaging architecture that allows for multi-astronomical unit distance applications and operation within broad temperature extremes (200).
Figure 8:
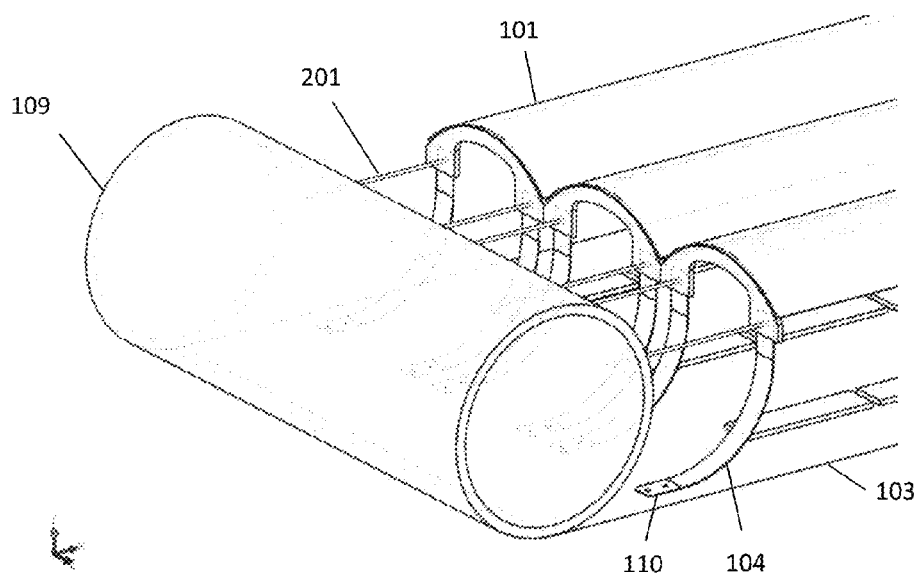
FIG. 8—Depicts a close up from FIG. 7 of the outboard solar array portion of the mandrel deployable structure (109), associated longitudinal high tension chords (201), curved lenticular spring elements (104), lenses (101), and the solar cell substrate (103).
Figure 9:
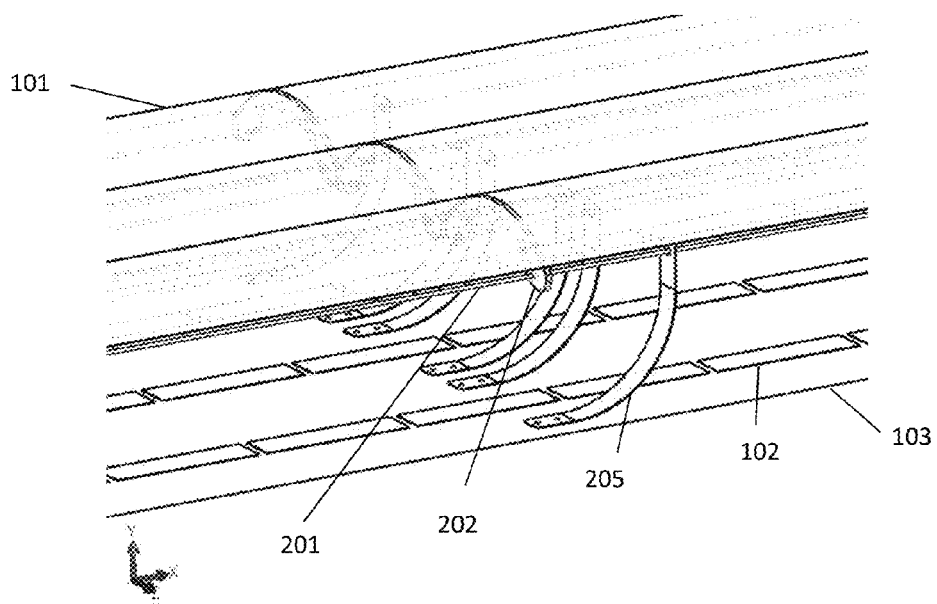
FIG. 9—Depicts a close up from FIG. 7 of the center portion of the blanket assembly (200) showing the deployed center lifting arches (205) that lift and position the high tension chords (201), sliding arches (202), and the lenses (101) into the correct focal height and lateral location.
Figure 10:
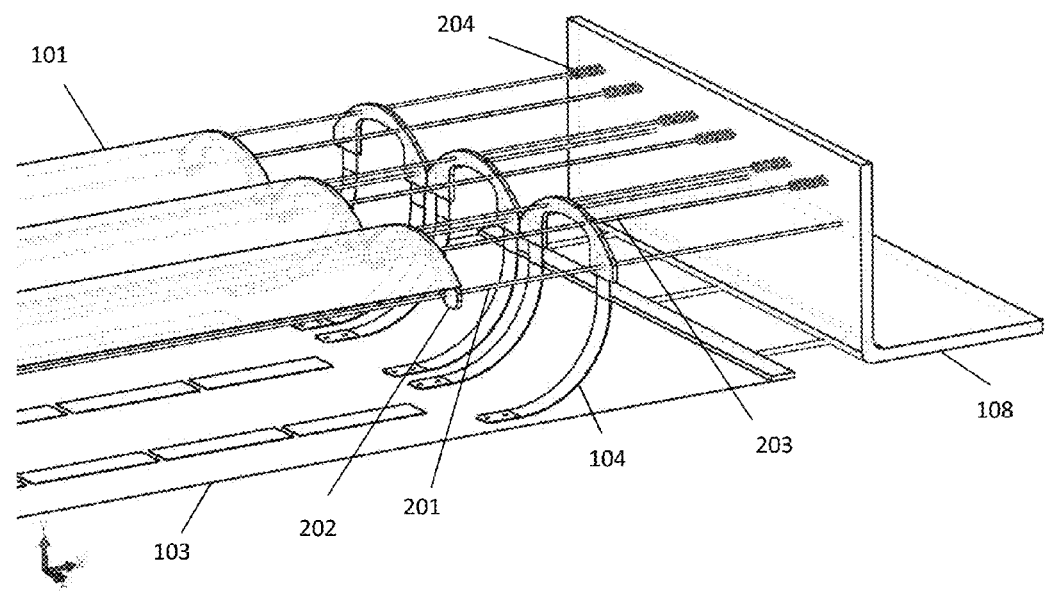
FIG. 10—Depicts a close up from FIG. 7 of the inboard solar array portion of the inboard root deployable structure (108), associated longitudinal high tension chords (201), curved lenticular spring elements (104), sliding arches (202), lenses (101), low tension lens chords (203), light tension springs (204), and the solar cell substrate (103).

FIG. 7 depicts relative components of another embodiment in isometric and orthographic views for the refractive concentrator space solar array panel assembly for a compact rolled stowage packaging architecture that allows for multi-astronomical unit distance applications and reliable operation within broad temperature extremes (200). Lenticular spring elements (104) provide both deployment lifting force and structure for the lenses (101). When stowed the spring/arch structures (104 and 105) lie nearly flat against the solar cell substrate/radiator assembly (103) and allow the lenses (101) to fall flat to blanket plane. The flattened planar assembly can then be rolled onto a mandrel type structure (109) for stowage into a compact rolled cylindrical volume. Longitudinal high tension chords (201) spanning the tip and root of the deployable structure provide final deployment positioning and lens tensioning with respect to the deployable structure and solar cell substrate/radiator assembly (103). The longitudinal high tension chords (201) are in the lens assembly plane so the blanket assembly deformation is minimized/eliminated. Complimentary to the design embodiment shown in FIG. 1, the design shown in FIG. 7 has lens assemblies (101) with at least one lenticular fixed arch structure (104) and one or more sliding arch structures (202). The sliding arch structures (202) attach to a non-fixed end of the lens, and periodically along the mid span of the lens depending on its length. The sliding arches (202) ride and slide upon the longitudinal high tension chords (201). The last sliding arch of a lens assembly has a series of low tension lens chords (203) attached to it, which are in turn attached to the inboard root structure (108) thru a light tension spring system (204). The center lifting arches (205) are comprised of lenticular spring elements that do not create a full arch, but lift the longitudinal tension chords to the proper height during the deployment of the blanket assembly. The embodiment shown in FIG. 7 rolls for stowage just like the embodiment shown in FIG. 1, with the exception that the longitudinal high tension chords (201) fall to the solar cell substrate/radiator (103) and the lenses (101) and sliding arches (202) fall with the chords. The light tension springs (204) and sliding arches (202) allow all lens assembly rows to accommodate very large thermal contractions or expansions while simultaneously maintaining proper lens tensioning and precise lens optical shape when exposed to very broad temperature environments. FIG. 8 depicts a close up from FIG. 7 of the outboard solar array portion of the mandrel deployable structure (109), associated longitudinal high tension chords (201), curved lenticular spring elements (104), lenses (101), and the solar cell substrate (103). As the mandrel structure (109) is rolled for stowage; the tension chords (201) become slack, the lenses (101) become slack, and the mandrel rolls up onto the curved lenticular spring elements (104) which forces the lenses (101) in contact with the solar cell substrate (103) and in the same plane to enable rolled stowage. FIG. 9 depicts a close up from FIG. 7 of the center portion of the blanket assembly (200) showing the deployed center lifting arches (205) that lift and position the high tension chords (201), sliding arches (202), and the lenses (101) into the correct focal height and lateral location. Each lens row (101) is in even and consistent lateral and longitudinal tension within the assembly. The feature shown in FIG. 7 can be periodically replicated along the length of the entire solar array with as many center lifting arches (205) and sliding arches (202) as required to ensure precise location and alignment of the lenses (101). FIG. 10 depicts a close up from FIG. 7 of the inboard solar array portion of the inboard root deployable structure (108), associated longitudinal high tension chords (201), curved lenticular spring elements (104), sliding arches (202), lenses (101), low tension lens chords (203), light tension springs (204), and the solar cell substrate (103).

Figure 11:
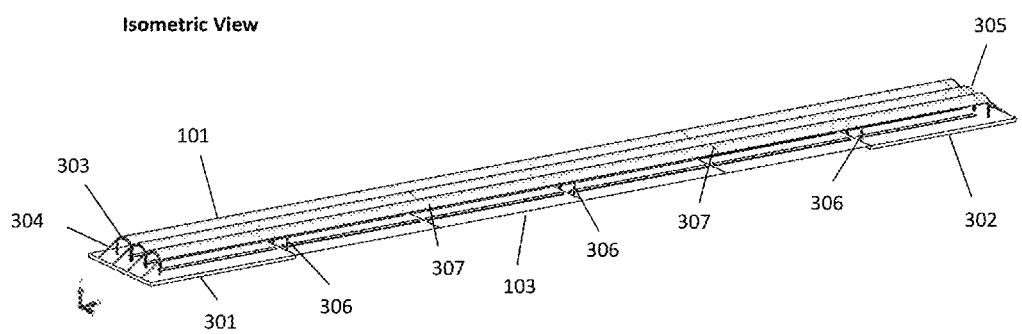
FIG. 11—Depicts relative components in isometric and orthographic views for the refractive concentrator space solar array panel assembly for a compact accordion-folded flat-pack stowed architecture (300).
Figure 11:
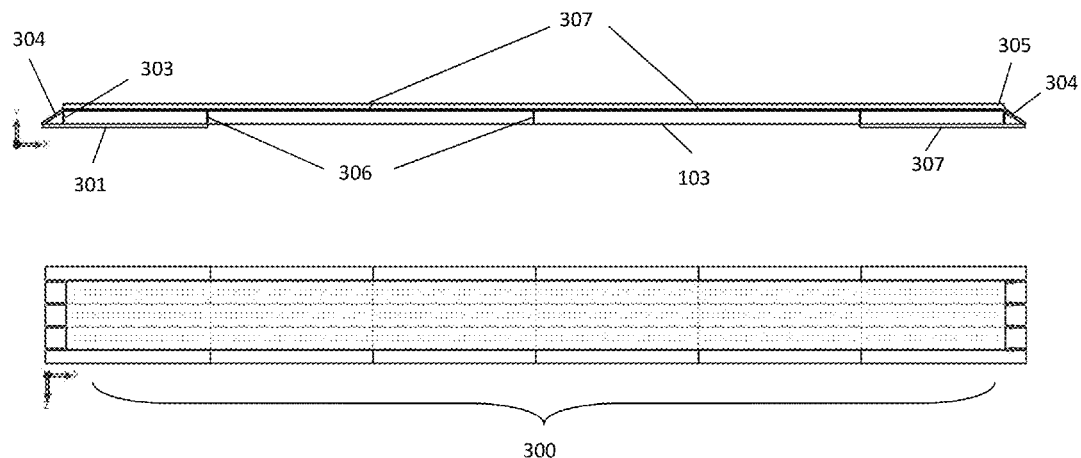
Figure 12:
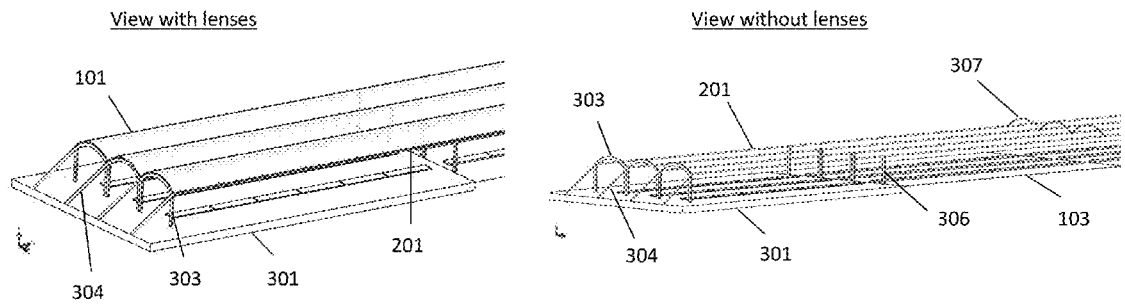
FIG. 12—Depicts relative components at the outboard tip, mid span, and inboard base regions in isometric views with and without lenses (101) for the refractive concentrator space solar array panel assembly for a compact accordion-folded flat-pack stowed architecture.
Figure 12:
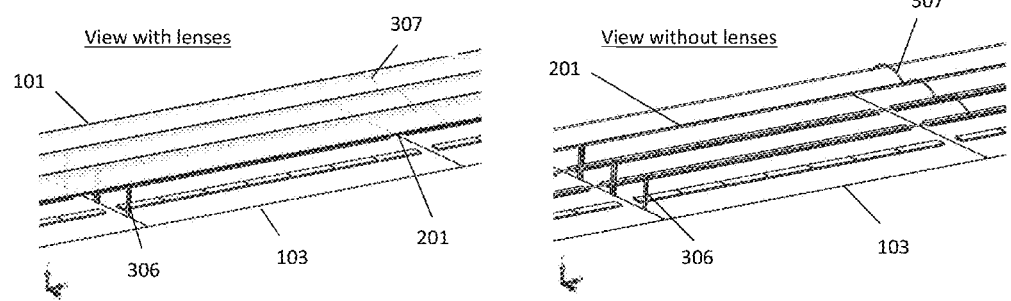
Figure 12:
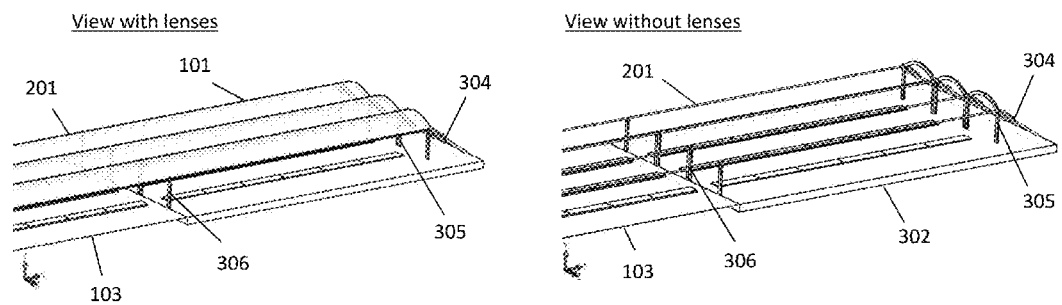
Figure 13:
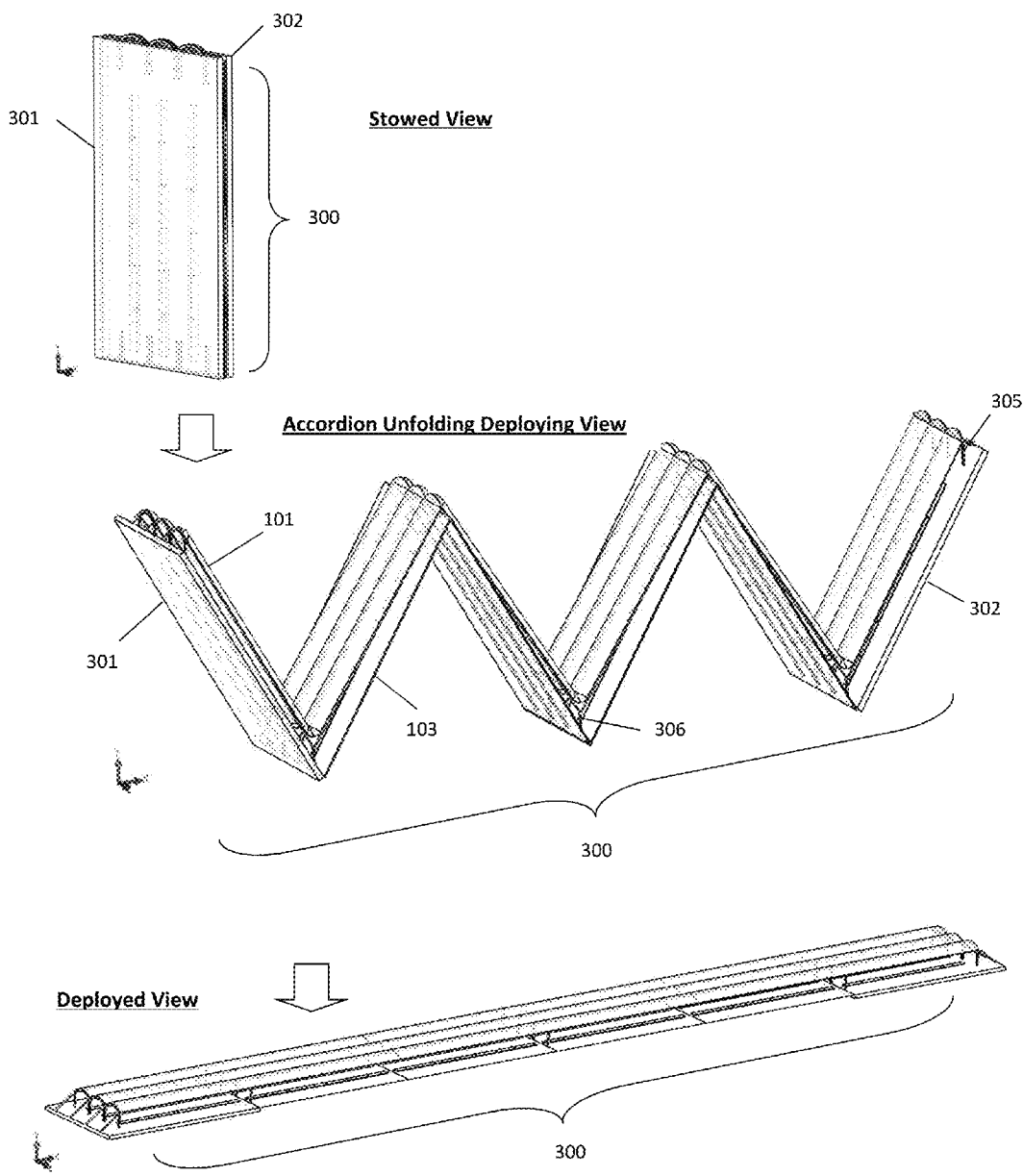
FIG. 13—Sequence of images depicting the entire deployment sequence of the refractive concentrator space solar array panel assembly for a compact accordion-folded flat-pack stowed architecture (300).

FIG. 11 depicts relative components of another embodiment in isometric and orthographic views for the refractive concentrator space solar array panel assembly for a compact accordion-folded flat-pack stowed architecture (300). Stiff tip and base platens (301 and 302) at each end of the blanket assembly (300) provide stiffness, strength, and captivity of the blanket assembly (300) for survivability within a launch vibration environment. Tip side arch structures (303) attached to lens rows (101) are anchored to align at 90 degrees to the tip platen (301) in the deployed configuration through discrete length diagonal members (304). Base side arch structures (305) attached to the opposite end of the lens row (101) are anchored to align at 90 degrees to the base platen (302) in the deployed configuration through discrete length diagonal members (304). High tension chords (201) span between the base side arch structures (305) and tip side arch structures (303). Column structures (306) located periodically through the blanket midspan, and coinciding periodically with a blanket fold-hinge location and attaching to the blanket fold-hinge location, periodically support the high tension chords (201) to provide proper positioning, location, support of the lens assemblies (101). Half arches (307) periodically attached along the length of each lens row (101) are also attached to the tensioned chords (201) at their base and maintain precise lens location and shape over the lens rows. FIG. 12 depicts relative components of the outboard tip, midspan, and inboard base regions in isometric views with and without lenses (101) for the refractive concentrator space solar array panel assembly for a compact accordion-folded flat-pack stowed architecture. FIG. 13 depicts images showing the entire deployment sequence of the refractive concentrator space solar array panel assembly for a compact accordion-folded flat-pack stowed architecture (300). In the stowed configuration the concentrator blanket assembly (300) occupies a compact flat-package that contained within the base and tips platens (301 & 302). During deployment, that concentrator blanket assembly (300) is unfolded in an accordion manner and the lens assemblies (101) and auxiliary support structures, arches, and chords deploy from the solar cell side of the substrate/radiator assembly. At final deployment the concentrator blanket assembly is tensioned and preloaded to provide precise and accurate alignment of the lens rows (101) with respect to the solar cell rows (102).

Figure 14:
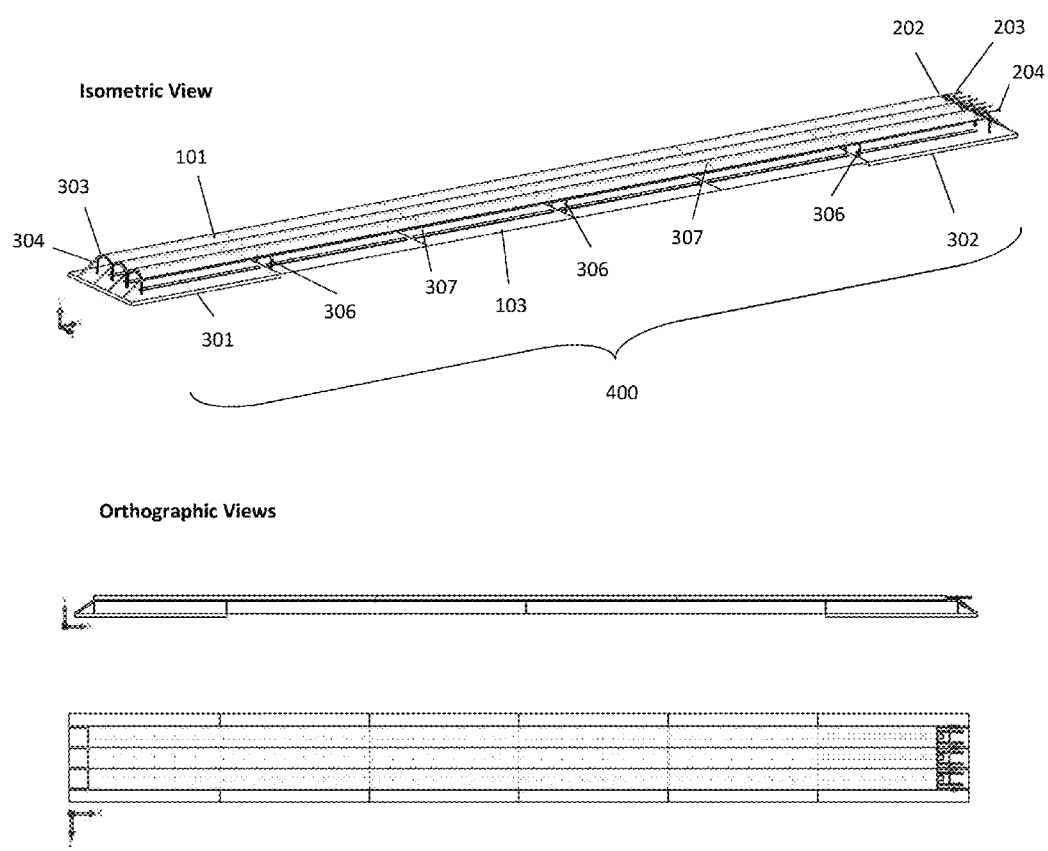
FIG. 14—Depicts relative components in isometric views for the refractive concentrator space solar array panel assembly (400) for a compact accordion-folded flat-pack stowed architecture that is operable in multi astronomical unit distances and in broad temperature extreme environments.

FIG. 14—Depicts relative components of another embodiment in isometric views for the refractive concentrator space solar array panel assembly (400) for a compact accordion-folded flat-pack stowed architecture that is operable in multi astronomical unit distances an in broad temperature extreme environments. The embodiment is similar to the design shown in FIG. 11, with the exception that sliding arches and spring elements are integrated and positioned in-line with the lens rows to maintain proper lens tension during operation at broad temperature extremes. Stiff tip and base platens (301 and 302) at each end of the blanket assembly (300) provide stiffness, strength, and captivity of the blanket assembly (300) for survivability within a launch vibration environment. Tip side arch structures (303) attached to lens rows (101) are anchored to align at 90 degrees to the top platen (301) in the deployed configuration through discrete length diagonal members (304). Base side arch structures (305) attached to the opposite end of the lens row (101) are anchored to align at 90 degrees to the base platen (302) in the deployed configuration through discrete length diagonal members (304). High tension chords (201) span between the base side arch structures (305) and tip side arch structures (303). Column structures (306) located periodically through the blanket mid-span, and coinciding periodically with a blanket fold-hinge location and attaching to the blanket fold-hinge location, periodically support the high tension chords (201) to provide proper positioning, location, support of the lens assemblies (101). Half arches (307) periodically attached along the length of each lens row (101) are also attached to the tensioned chords (201) at their base and maintain precise lens location and shape over the lens rows. Each lens row or segment terminates into a sliding arch (202) which slides and ride upon the high tension chords (201). Light tension chords (203) attached to the sliding arches (202) terminate to the inboard root structure through a light tension spring system (204) and provide tension and stroke to accommodate broad thermal expansions and contractions for the lens row or segment (101)

such that lens alignment and precise shape is maintained. Deployment sequence is similar to the embodiment deployment shown in FIG. 13.

Figure 15:
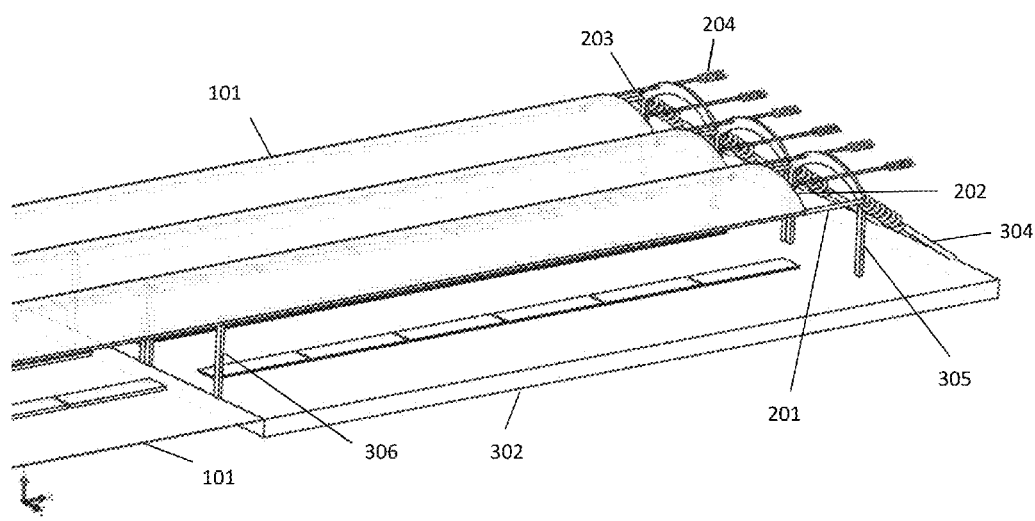
FIG. 15—Depicts relative components in isometric view of the inboard base region of the refractive concentrator space solar array panel assembly (400).

FIG. 15 depicts relative components of another embodiment in isometric view of the inboard base region of the refractive concentrator space solar array panel assembly (400) for a compact accordion-folded flat-pack stowed architecture that is operable in multi astronomical unit distances and in broad temperature extreme environments. FIG. 15 provides details of lens row or segment termination into a sliding arches (202) which slide and ride upon the high tension chords (201). Light tension chords (203) attached to the sliding arches (202) terminate to the inboard root structure through a light tension spring system (204) and provide tension and stroke to accommodate broad thermal expansions and contractions for the lens row or segment (101) such that lens alignment and precise shape is maintained.

Figure 16:
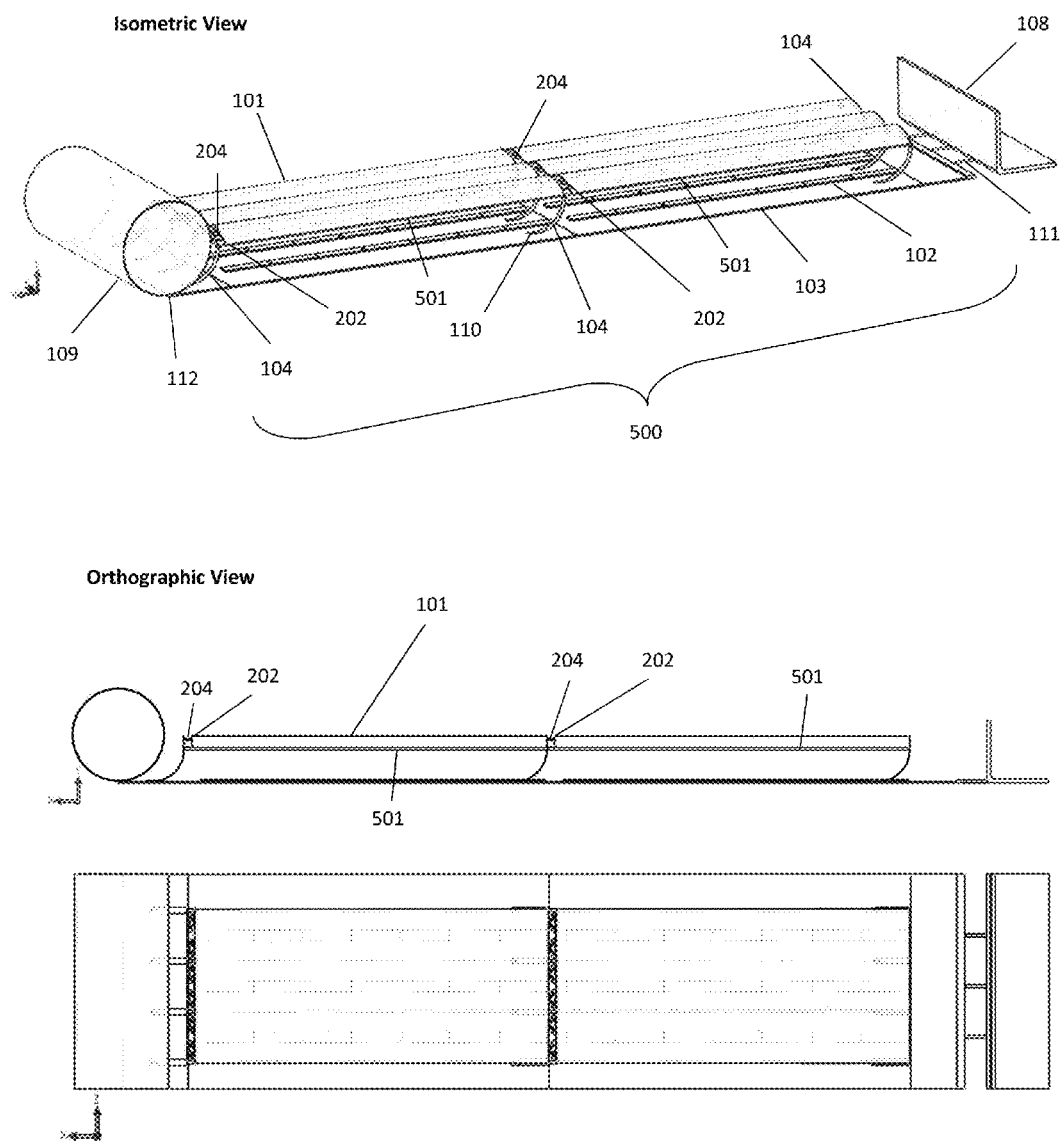
FIG. 16—Depicts relative components in isometric and orthographic views for the refractive concentrator space solar array panel assembly (500) that has both compact rolled or accordion folded stowage capability, can orientate the lens assemblies both laterally or longitudinally along the deployment axis, and is operable in multi astronomical unit distances and in broad temperature extreme environments.
Figure 17:
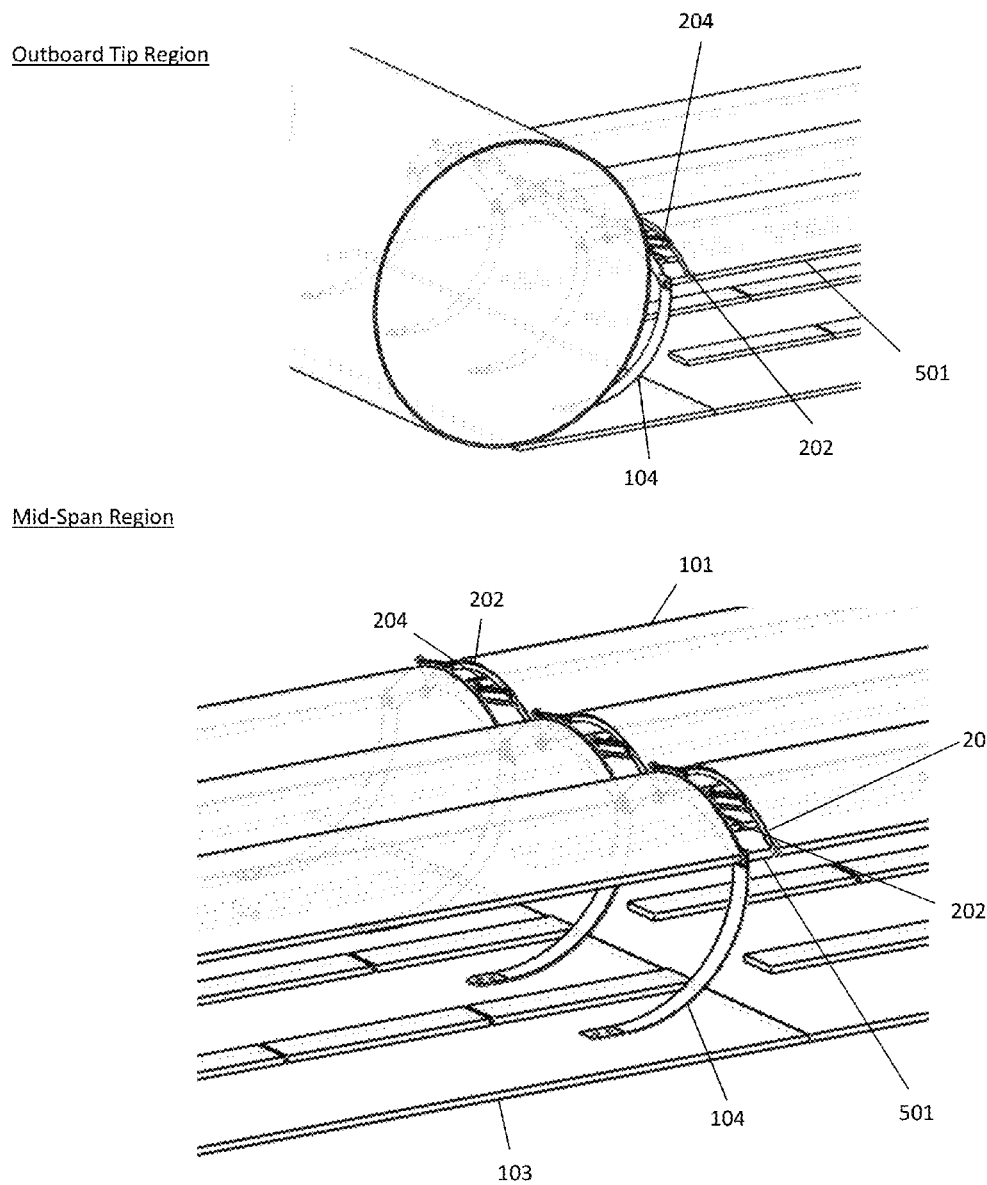
FIG. 17—Depicts close-ups of relative components at the outboard tip and mid span regions of the refractive concentrator space solar array panel assembly (500).
Figure 18:
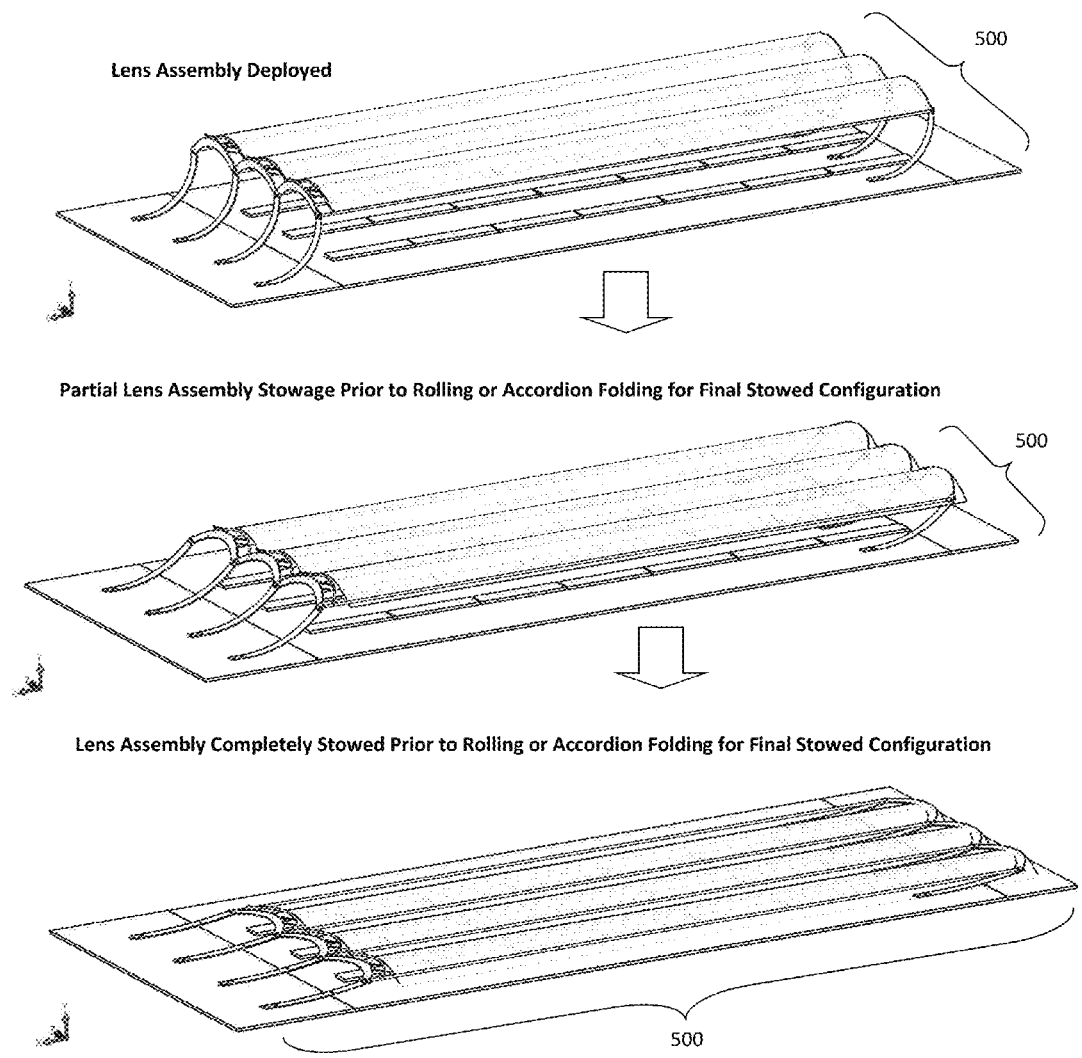
FIG. 18—Depicts the refractive concentrator blanket assembly (500) stowage sequence of lenses (101) prior to blanket assembly final rolling or accordion folding to final stowed configuration.
Figure 19:
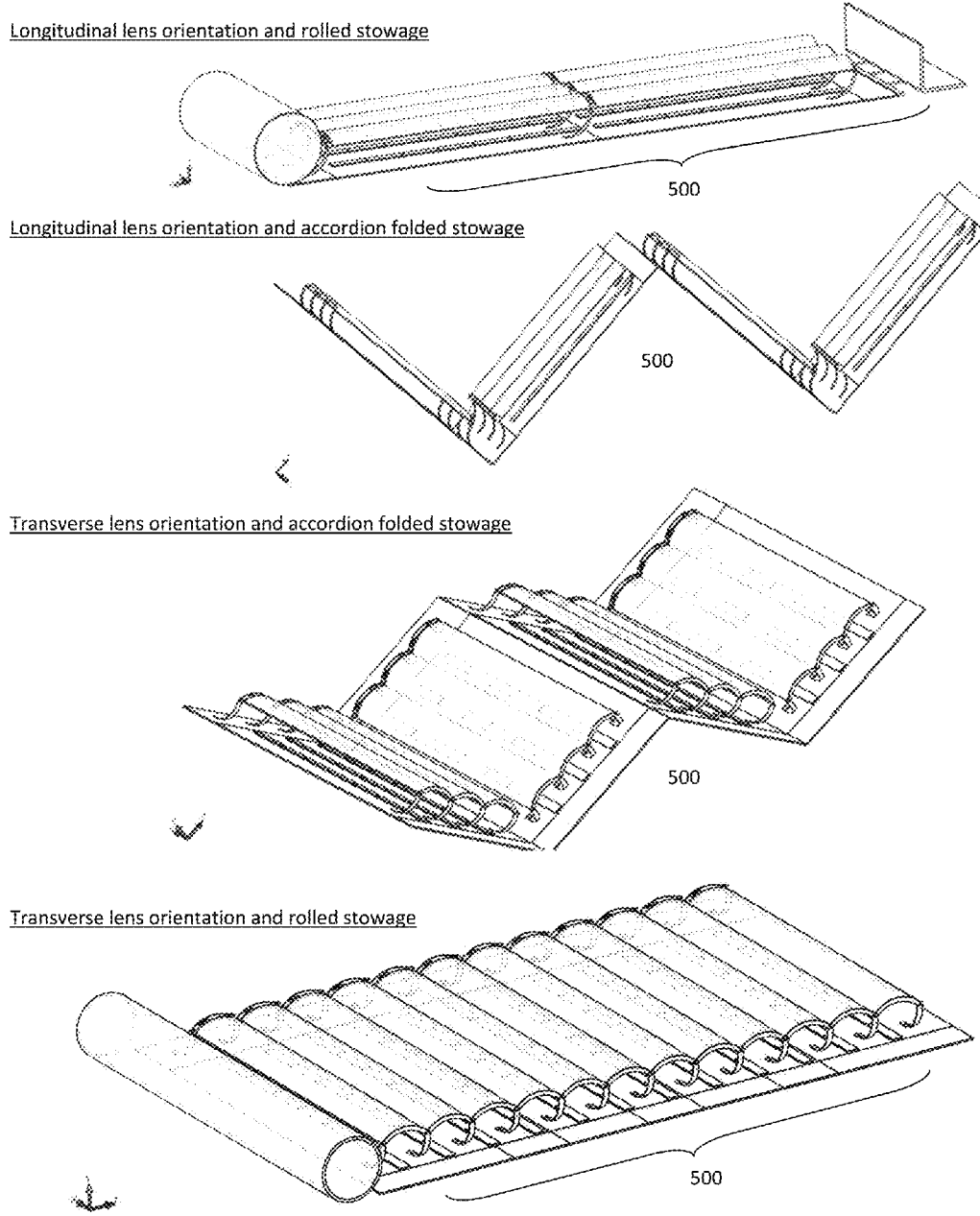
FIG. 19—Depicts the refractive concentrator blanket assembly (500) and longitudinal and lateral orientation variations of the possible stowage configurations.

FIG. 16 depicts relative components of the final embodiment in isometric and orthographic views for the refractive concentrator space solar array panel assembly (500) that has both compact rolled or accordion folded stowage capability, lateral or longitudinal lens orientation capability with respect to the deployment axis, and is operable in multi astronomical unit distances and in broad temperature extreme environments. The embodiment is similar to the design shown in FIG. 1, with the exceptional that sliding arches (202), light spring elements (204), and compression rods (501) are integrated within the lens structural support system and are positioned in-line with the lens rows to maintain proper lens tension during operation at broad temperature extremes, and without the need to terminate the tip or base portions of the lens rows to either the inboard or outboard deployment structures. The compression rods (501) independently react the tension loads within the lens assemblies (101) applied by the light spring elements (204) which produces a negligible resultant load in the solar cell substrate/radiator assembly (103). The self support feature and independent load reaction that the compression rods (501) provide allows for the placement of the lens rows and solar cell rows either longitudinally or laterally with respect to the deployment axis. FIG. 17 depicts close-ups of relative components at the outboard tip and mid-span regions of the refractive concentrator space solar array panel assembly (500). FIG. 18 depicts the refractive concentrator blanket assembly (500) stowage sequence of lenses (101) prior to blanket assembly subsequent rolling or accordion folding to the final stowed configuration. The concentrator blanket assembly (500) is very versatile and allows for lens orientation in the longitudinal and lateral transverse directions, depending upon application. FIG. 19 depicts the refractive concentrator blanket assembly (500) and the possible lens positional orientation variations that the configuration provides, including lens orientation examples in a lateral transverse configuration that is opposite to the deployment direction, and lens orientation in the conventional longitudinal deployment direction.

The invention claimed is:

1. A deployable solar array panel comprising an accordion folded structure that forms a compact package for stowage and a longitudinal, substantially rectangular planar structure upon deployment, said solar array comprising:
   a. a top surface, a bottom surface opposite said top surface, two ends, and two open sides, wherein a first end of said two ends comprises a tip end, wherein a second end of said two ends comprises a root end opposite said tip end,
   b. a segmented solar blanket assembly, wherein said segmented solar blanket assembly defines said bottom surface of said solar array panel, wherein said segmented solar blanket assembly is comprised of a segmented substrate supporting an array of solar cells wherein each segment of said segmented substrate is allowed to hinge at its ends, wherein said segmented substrate is interspersed with interfacing components connecting to each segment of said segmented substrate, and
   c. a segmented refractive lens assembly defining said top surface of said solar array panel, wherein said refractive lens assembly comprises a set of flexible lenses supported by two or more supportive frames, said supportive frames of said refractive lens assembly being aligned with said interfacing components of said segmented solar blanket, wherein said refractive lens assembly is spatially offset from said segmented solar blanket assembly such that optimal concentration of solar radiation upon said array of solar cells is achieved.

2. A deployable solar array panel as in claim 1 further comprising an inline cabling system, wherein said inline cabling system spans the longitudinal length of said segmented solar blanket, wherein said interfacing components comprise a set of positioning columns and arched frames forming a fixed connection between said segmented solar blanket and said segmented refractive lens assembly at said root end and said tip end, said interfacing components further comprising a set of positioning columns and arched frames connected to said inline cabling system and forming a pivoting connection between said segmented solar blanket and said segmented refractive lens assembly at said ends between each segment, the inline cabling system aligning and supporting each of said arched frames.

3. A deployable solar array panel as in claim 2 wherein at least one of said supportive frames is a sliding frame, wherein said sliding frame is free to slide along the inline cable, wherein said sliding frame is attached to said fixed connection by a low tension cable, thereby providing inline tension while allowing for thermal expansion and contraction of said refractive lens assembly.

4. A deployable solar array panel as in claim 1 wherein said interfacing components comprise two or more rows of elastic structural elements connecting to each segment of said segmented solar blanket, wherein each row of said two or more rows is congruent with one of said supportive frames of said refractive lens assembly, wherein each row is connected to each adjacent row by compression rods, and wherein said compression rods maintain spacing between said rows while providing structural support for said refractive lens assembly.

5. A deployable solar array panel as in claim 4, wherein one of said supportive frames is a sliding frame, wherein said sliding frame is free to slide along said compression rods, wherein said sliding frame is attached to one row of said two or more rows of elastic structural elements by a low tension cable or spring, thereby providing inline tension while allowing for thermal expansion and contraction of said refractive lens assembly.

6. A deployable solar array panel comprising:
   a solar blanket assembly defining a bottom surface of said solar array panel, the solar blanket assembly comprising an array of solar cells;
   a refractive lens assembly defining a top surface of said solar array panel, the refractive lens assembly comprising a plurality of flexible lenses;

a plurality of supports having first ends and second ends, the first end of each of said support pivotably attached to said solar blanket assembly and the second send of each of said supports attached to said refractive lens assembly such that the refractive lens assembly is spatially offset from the solar blanket assembly for optimal concentration of solar radiation on said array of solar cells, wherein the plurality of supports are configured to pivot unidirectionally to allow said refractive lens assembly to collapse onto said solar blanket assembly in a stowed configuration of said deployable solar array panel.

7. The deployable solar array panel according to claim 6, wherein the solar array blanket assembly and refractive lens assembly comprise a first segment of said deployable solar array panel, the deployable solar array panel comprising a plurality of such segments hingeably connected to one another, the plurality of supports attached to each given blanket assembly configured to fold unidirectionally such that the refractive lens assemblies collapse onto the solar blanket assemblies and said deployable solar array panel folds in an accordion configuration when in the stowed configuration.

8. The deployable solar array according to claim 6, wherein said supports comprise a positioning column and arched frame, the positioning column pivotably attached to the solar blanket assembly and the arched frame attached to the refractive lens assembly.

9. The deployable solar array according to claim 6, further comprising an arched reinforcement attached to said refractive lens assembly along an underside thereof, the arched reinforcement disposed between two of said supports.

10. The deployable solar array according to claim 9, wherein said supports comprise two or more rows of elastic structural elements connecting each segment of said deployable array structure, each of said two or more rows congruent with one of said arched reinforcements, wherein each row is connected to each adjacent row by compression rods that maintain spacing between the rows and provide structural support for said refractive lens assembly.

11. The deployable solar array according to claim 10, wherein one of arched reinforcements is a sliding arched reinforcement, the sliding arched reinforcement free to slide along one of said compression rods, wherein said sliding arched reinforcement is attached to one of said rows of elastic structural elements by a low tension cable or spring, thereby providing inline tension while allowing for thermal expansion and contraction of said refractive lens assembly.

* * * * *